(12) United States Patent
Sung et al.

(10) Patent No.: US 11,527,544 B2
(45) Date of Patent: Dec. 13, 2022

(54) THREE-DIMENSIONAL MEMORY DEVICE AND MANUFACTURING METHOD THEREOF

(71) Applicant: SK hynix Inc., Icheon-si (KR)

(72) Inventors: Sang Hyun Sung, Icheon-si (KR); Jin Ho Kim, Icheon-si (KR); Sung Lae Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 235 days.

(21) Appl. No.: 17/014,370

(22) Filed: Sep. 8, 2020

(65) Prior Publication Data
US 2021/0366919 A1     Nov. 25, 2021

(30) Foreign Application Priority Data

May 25, 2020   (KR) ........................ 10-2020-0062261

(51) Int. Cl.
| | | |
|---|---|---|
| *H01L 27/11539* | (2017.01) | |
| *H01L 23/528* | (2006.01) | |
| *H01L 27/11556* | (2017.01) | |
| *H01L 27/11582* | (2017.01) | |

(52) U.S. Cl.
CPC .... *H01L 27/11539* (2013.01); *H01L 23/5283* (2013.01); *H01L 27/11556* (2013.01); *H01L 27/11582* (2013.01)

(58) Field of Classification Search
CPC ..... H01L 27/11539; H01L 2225/06544; H01L 23/5283; H01L 2224/05009; H01L 2224/05025; H01L 2224/05087; H01L 2224/0509; H01L 2224/0557; H01L 2224/08146
See application file for complete search history.

(56) References Cited

U.S. PATENT DOCUMENTS 10,672,782 B2 *   6/2020   Utsumi ................... H01L 24/16

FOREIGN PATENT DOCUMENTS

| | | |
|---|---|---|
| JP | 2018-026518 A | 2/2018 |
| KR | 10-2016-0128731 A | 11/2016 |
| KR | 10-2019-0061376 A | 6/2019 |

* cited by examiner

*Primary Examiner* — Amar Movva

(57) ABSTRACT

A three-dimensional memory device includes an electrode structure including a plurality of interlayer dielectric layers and a plurality of electrode layers which are alternately stacked on a first substrate, each of the plurality of electrode layers having a pad part which does not overlap with another electrode layer positioned on the electrode layer; a pass transistor positioned below the first substrate; and a first contact passing through the electrode structure from the pad part of one of the plurality of electrode layers, and coupling the pad part and the pass transistor.

14 Claims, 24 Drawing Sheets

THREE-DIMENSIONAL MEMORY DEVICE AND MANUFACTURING METHOD THEREOF

CROSS-REFERENCE TO RELATED APPLICATION

The present application claims priority under 35 U.S.C. § 119(a) to Korean Patent Application No. 10-2020-0062261 filed in the Korean Intellectual Property Office on May 25, 2020, which is incorporated herein by reference in its entirety.

BACKGROUND

1. Technical Field

Various embodiments generally relate to a semiconductor technology, and particularly, to a three-dimensional memory device and a manufacturing method thereof.

2. Related Art

In order to meet demands for excellent performance and low is price that consumers demand, the degree of integration in a memory device must increase. Since the degree of integration of a two-dimensional or planar memory device is mainly determined by the area occupied by a unit memory cell, the degree of integration is greatly influenced by the level of a fine pattern forming technique. However, because highly expensive equipment is needed for the formation of a fine pattern, the degree of integration of a two-dimensional memory device is still limited, although it is increasing. To overcome such limitations, a three-dimensional memory device including three-dimensionally arranged memory cells has been proposed. In the three-dimensional memory device, the degree of integration may be increased by increasing the stack number of electrode layers which are coupled to the memory cells.

SUMMARY

Various embodiments are directed to measures capable of reducing the size of a three-dimensional memory device and improving reliability.

In an embodiment, A three-dimensional memory device comprising: an electrode structure including a plurality of interlayer dielectric layers and a plurality of electrode layers that are alternately stacked on a first substrate, each of the plurality of electrode layers having a pad part which does not overlap with another electrode layer positioned on the electrode layer; a pass transistor positioned below the first substrate; and a first contact passing through the electrode structure from the pad part of one of the plurality of electrode layers, and coupling the pad part and the pass transistor.

In an embodiment, a method for manufacturing a three-dimensional memory device may include: forming a pre-stack by alternately stacking a plurality of interlayer dielectric layers and a plurality of first sacrificial layers on a substrate; forming a step structure having a plurality of step surfaces corresponding to the plurality of first sacrificial layers, respectively, by etching the pre-stack; forming a contact hole, which passes through the pre-stack and the substrate in a vertical direction and is coupled to a wiring line defined below the substrate, through at least one of the step surfaces; forming a contact in the contact hole with a sidewall dielectric layer interposed therebetween; removing the sidewall dielectric layer, which is defined in an upper end portion of the contact hole, to expose an uppermost first sacrificial layer from among the plurality of first sacrificial layers through which the contact hole passes and a side surface of an upper end portion of the contact; forming a second sacrificial layer in a space where the sidewall dielectric layer is removed; and replacing the plurality of first sacrificial layers and the second sacrificial layer with a conductive material.

In an embodiment, a method for manufacturing a three-dimensional memory device may include: forming a pre-stack by alternately stacking a plurality of interlayer dielectric layers and a plurality of first sacrificial layers on a substrate; forming a step structure having a plurality of step surfaces corresponding to the plurality of first sacrificial layers, respectively, by etching the pre-stack; forming a contact hole, which passes through the pre-stack and the substrate in a vertical direction and is coupled to a wiring line defined below the substrate, through at least one of the step surfaces; forming a sacrificial pillar in the contact hole with a sidewall dielectric layer interposed therebetween; removing the sidewall dielectric layer, which is defined in an upper end portion of the contact hole, to expose an uppermost first sacrificial layer among first sacrificial layers through which the contact hole passes and a side surface of an upper end portion of the sacrificial pillar; forming a second sacrificial layer in a space where the sidewall dielectric layer is removed; and replacing the plurality of first sacrificial layers, the sacrificial pillar and the second sacrificial layer with a conductive material.

DETAILED DESCRIPTION

Figure 1:
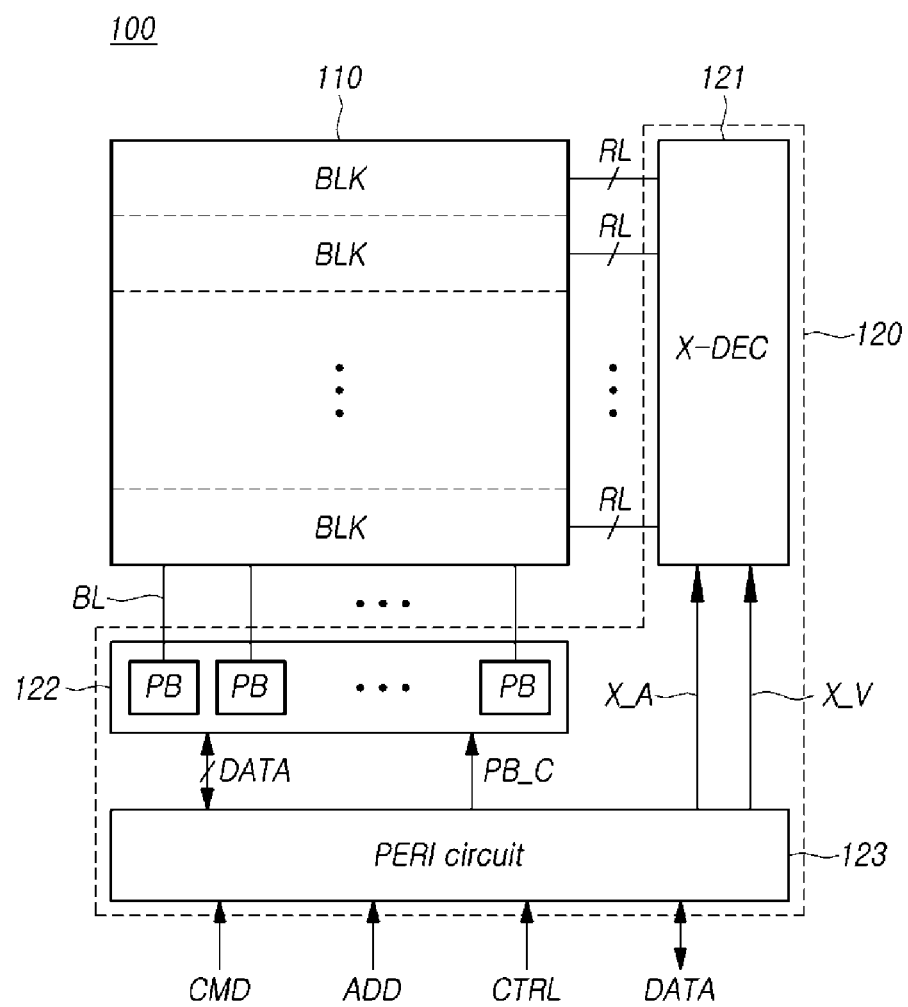
FIG. 1 is a block diagram illustrating a representation of a memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

Because the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article (e.g., "a," "an" or "the") is used when referring to a singular noun, the article may include a plural of that noun unless specifically stated otherwise. In interpreting components in embodiments of the disclosure, they should be interpreted as including error margins even in the absence of explicit statements.

Also, in describing the components of the disclosure, there may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it should be understood that the component may be directly "connected," "coupled" or "linked" to another component, with or without another component may also be "interposed" therebetween, or the component may be "connected," "coupled" or "linked" to the another component via yet another component. In describing positional relationship, such as "an element A on an element B," "an element A above an element B," "an element A below an element Bi" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

FIG. 1 is a block diagram illustrating a representation of a memory device in accordance with an embodiment of the disclosure.

Referring to FIG. 1, a memory device 100 in accordance with an embodiment of the disclosure may include a memory cell array 110 and a logic circuit 120. The logic circuit 120 may include a row decoder (X-DEC) 121, a page buffer circuit 122 and a peripheral circuit (PERI circuit) 123.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor which are coupled in series. While the following descriptions represent a case in which the disclosed technology is used in a vertical NAND flash device, it is to be noted that the disclosure is not limited thereto and other volatile or nonvolatile memory devices are contemplated by the disclosure.

The memory cell array 110 may be coupled to the row decoder 121 through a plurality of row lines RL. The row lines RL may include at least one drain select line, a plurality of word lines and at least one source select line. The memory cell array 110 may be coupled to the page buffer circuit 122 through a plurality of bit lines BL.

The row decoder 121 may select any one among the memory blocks BLK included in the memory cell array 110, in response to a row address X_A provided from the peripheral circuit 123. The row decoder 121 may transfer an operating voltage X_V, provided from the peripheral circuit 123, to row lines RL coupled to a memory block BLK that is selected from among the memory blocks BLK included in the memory cell array 110. In order to transfer the operating voltage X_V to the row lines RL, the row decoder 121 may include a plurality of pass transistors, which are coupled to the row lines RL of the memory blocks BLK.

The page buffer circuit 122 may include a plurality of page buffers PB, which are coupled to the bit lines BL, respectively. The page buffer circuit 122 may receive a page buffer control signal PB_C from the peripheral circuit 123, and may transmit and receive a data signal DATA to and from the peripheral circuit 123. The page buffer circuit 122 may control the bit lines BL, which are arranged in the memory cell array 110, in response to the page buffer control signal PB_C. For example, the page buffer circuit 122 may detect data, stored in a memory cell of the memory cell array 110, by sensing the signal of a bit line BL of the memory cell array 110 in response to the page buffer control signal PB_C, and may transmit the data signal DATA to the peripheral circuit 123 depending on the detected data. The page buffer circuit 122 may apply a signal to a bit line BL, based on the data signal DATA received from the peripheral circuit 123, in response to the page buffer control signal PB_C, and thereby, may write data in a memory cell of the memory cell array 110. The page buffer circuit 122 may write data in or read data from memory cells, which are coupled to an activated word line.

The peripheral circuit 123 may receive a command signal CMD, an address signal ADD and a control signal CTRL from outside the memory device 100, and may transmit and receive data DATA to and from a device outside the memory device 100, for example, a memory controller. The peripheral circuit 123 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages including the operating voltage X_V, which are required in the memory device 100.

Hereinbelow, in the accompanying drawings, a direction vertically projecting from the top surface of a substrate is defined as a vertical direction VD, and two directions parallel to the top surface of the substrate and intersecting with each other are defined as a first direction FD and a second direction SD, respectively. For example, the first direction FD may correspond to the extending direction of word lines and the arrangement direction of bit lines, and the second direction SD may correspond to the extending direction of the bit lines and the arrangement direction of the word lines. The first direction FD and the second direction SD may substantially perpendicularly intersect with each other. The first direction FD and the second direction SD may be orthogonal to the vertical direction VD. In the drawings, a direction indicated by an arrow and a direction opposite thereto represent the same direction.

Figure 2:
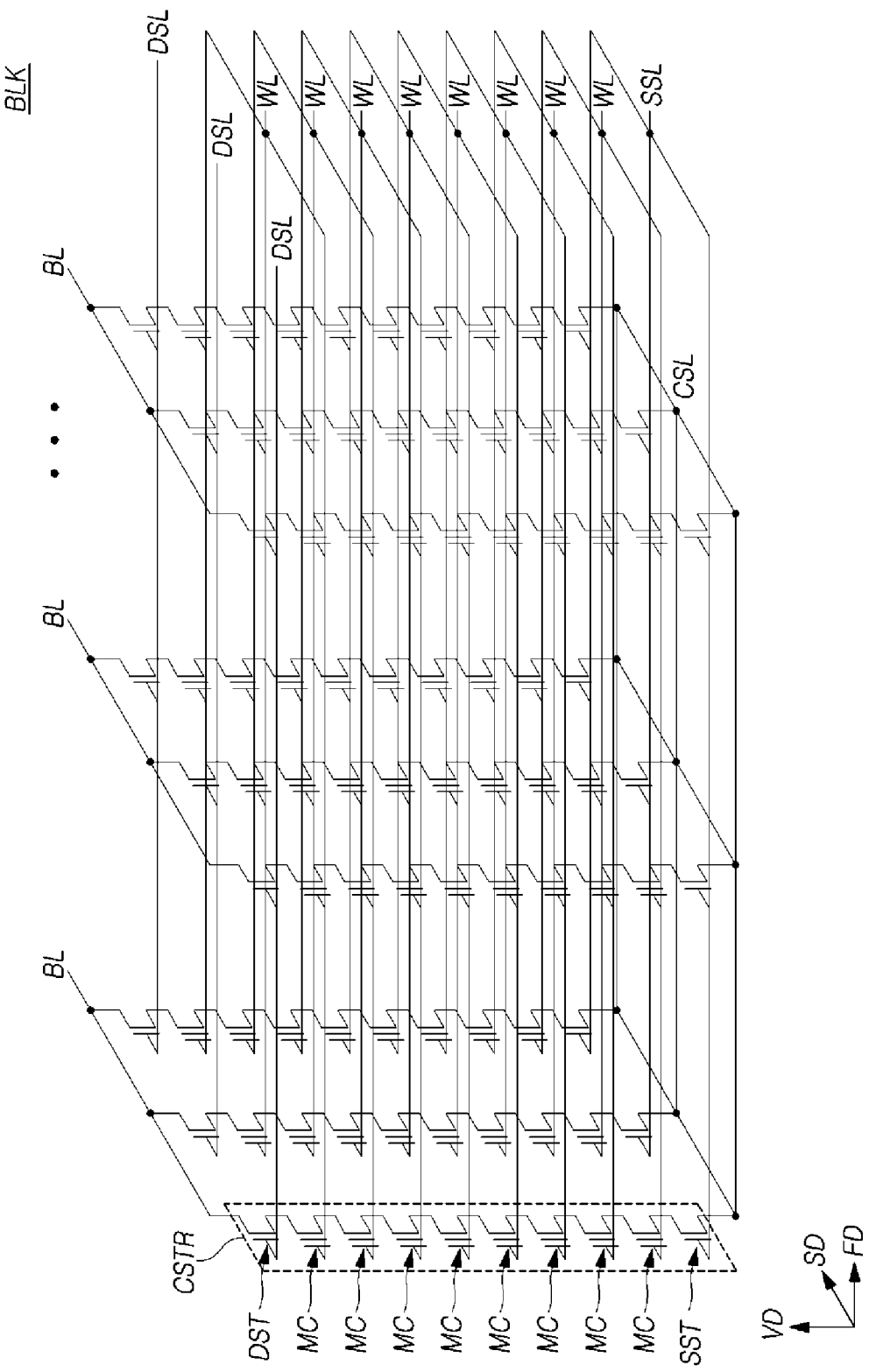
FIG. 2 is an equivalent circuit diagram illustrating a representation of a memory block illustrated in FIG. 1.

FIG. 2 is an equivalent circuit diagram illustrating a representation of one of the memory blocks BLK illustrated in FIG. 1.

Referring to FIG. 2, a memory block BLK may include a plurality of cell strings CSTR corresponding to a plurality of bit lines BL and to a common source line CSL. The bit lines BL may extend in a second direction SD, and may be arranged in a first direction FD. A plurality of cell strings CSTR may be coupled in parallel to each of the bit lines BL. The cell strings CSTR may be coupled in common to the common source line CSL. The plurality of cell strings CSTR may be coupled between the plurality of bit lines BL and the one common source line CSL.

Each of the cell strings CSTR may include a drain select transistor DST that is coupled to the bit line BL, a source select transistor SST that is coupled to the common source line CSL, and a plurality of memory cells MC that are coupled between the drain select transistor DST and the source select transistor SST. The drain select transistor DST, the memory cells MC and the source select transistor SST may be coupled in series in a vertical direction VD.

Drain select lines DSL, a plurality of word lines WL and a source select line SSL may be stacked between the bit lines BL and the common source line CSL in the vertical direction VD. Each of the drain select lines DSL may be coupled to the gates of corresponding drain select transistors DST. Each of the word lines WL may be coupled to the gates of corresponding memory cells MC. The source select line SSL may be coupled to the gates of source select transistors SST.

Memory cells MC included in the memory block BLK may be divided into physical page units or logical page units. For example, memory cells MC that share a word line WL and are coupled to different cell strings CSTR may configure one physical page. Such a page may be a basic unit of a read operation.

Figure 3:
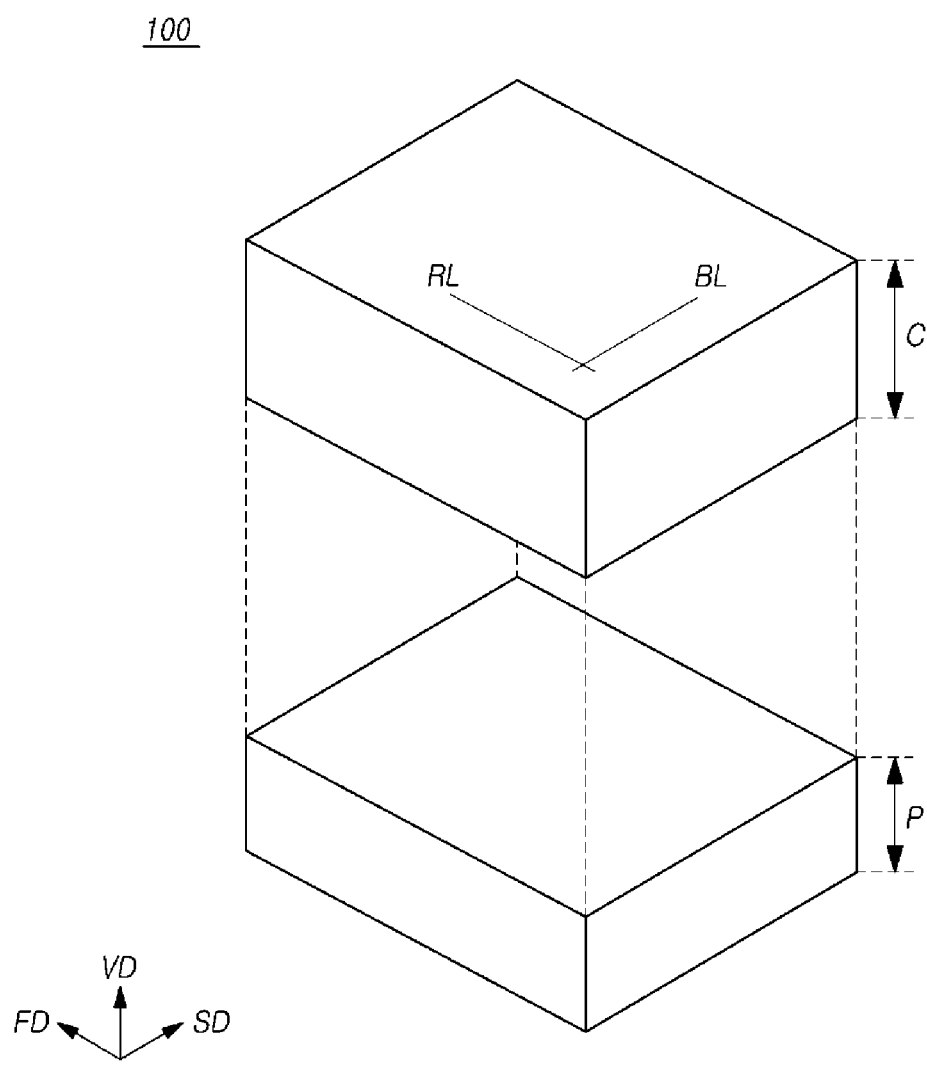
FIG. 3 is a perspective view schematically illustrating a representation of a memory device in accordance with an embodiment of the disclosure.

FIG. 3 is a perspective view schematically illustrating a representation of a memory device in accordance with an embodiment of the disclosure.

Referring to FIG. 3, a memory device 100 in accordance with an embodiment of the disclosure may include a logic structure P and a memory structure C. The memory structure C may be stacked on the logic structure P in the vertical direction VD. For the sake of convenience in explanation, FIG. 3 illustrates that the logic structure P and the memory structure C are spaced apart from each other in the vertical direction VD, but it should be understood that the top surface of the logic structure P and the bottom surface of the memory structure C are in contact with each other.

The logic structure P may include a row decoder (121 of FIG. 1), a page buffer circuit (122 of FIG. 1) and a peripheral circuit (123 of FIG. 1), and the memory structure C may include a memory cell array (110 of FIG. 1). In the memory structure C, a plurality of row lines RL may extend in the first direction FD, and a plurality of bit lines BL may extend in the second direction SD. Memory cells included in the memory cell array may be accessed by the plurality of row lines RL and the plurality of bit lines BL. The plurality of row lines RL and the plurality of bit lines BL may be electrically coupled to circuits, which are defined in the logic structure P. For example, the plurality of row lines RL may be coupled to the row decoder, and the plurality of bit lines BL may be coupled to the page buffer circuit.

The logic structure P and the memory structure C may be fabricated on a single wafer. For instance, after the logic structure P is fabricated, the memory structure C may be fabricated on the logic structure P. In this case, the memory device 100 may be defined as a PUC (peri under cell) structure. On the other hand, the logic structure P and the memory structure C may be fabricated on different wafers, which are then integrated by being bonded to each other. In this case, the memory device 100 may be defined as a POC (peri over cell) structure. In a POC structure, the logic structure P may be defined as a peripheral wafer, and the memory structure C may be defined as a cell wafer. By disposing components, other than the memory cell array, in a manner to overlap with the memory cell array in the vertical direction VD, both the PUC structure and the POC structure may effectively reduce a layout area.

Figure 4:
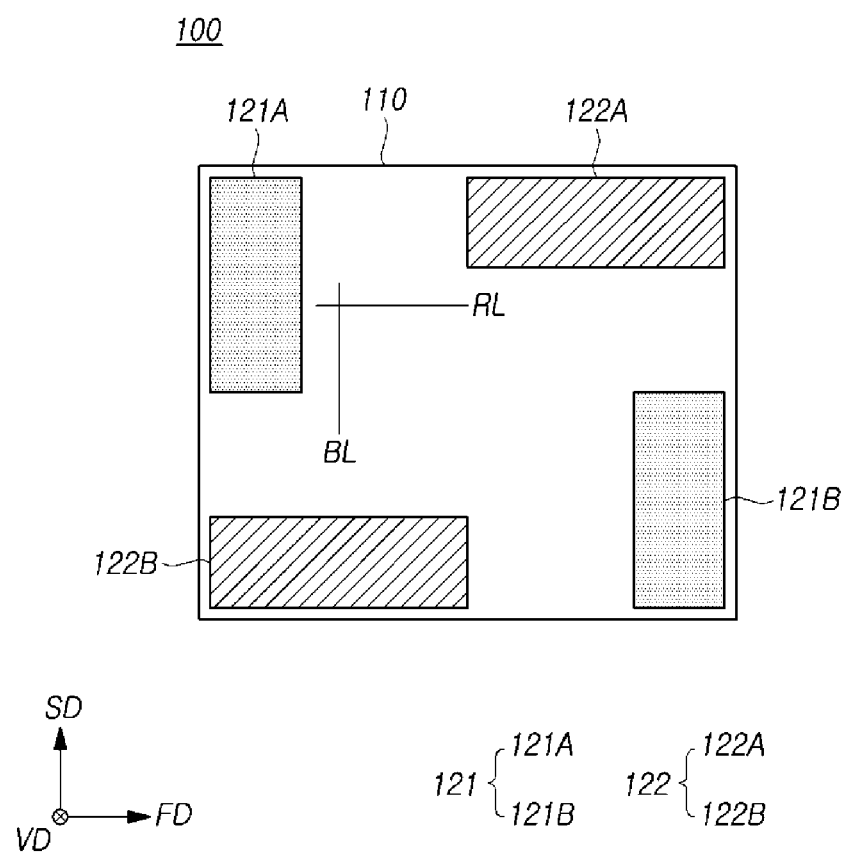
FIG. 4 is a top view schematically illustrating a representation of a memory device in accordance with an embodiment of the disclosure.

FIG. 4 is a top view schematically illustrating a representation of a memory device in accordance with an embodiment of the disclosure.

Referring to FIG. 4, as the degree of integration of a memory device 100 increases and the operation speed thereof increases, the delay of signals provided from a row decoder 121 to row lines RL needs to be reduced. Further, as the degree of integration of the memory device 100 increases and the operation speed thereof increases, the delay of signals applied from a page buffer circuit 122 to bit lines BL needs to be reduced, or signals received in the page buffer circuit 122 from the bit lines BL needs to be reduced.

To this end, elements configuring the row decoder 121 may be disposed to have a shape extending in the second direction SD as a direction in which the row lines RL are arranged, and elements configuring the page buffer circuit 122 may be disposed to have a shape extending in the first direction FD as a direction in which the bit lines BL are arranged.

Each of the row decoder 121 and the page buffer circuit 122 may be divided into two or more parts, and the parts may be disposed along the edges of a memory cell array 110 so as to increase an area overlapping with the memory cell array 110 in the vertical direction VD. For example, the row decoder 121 may be divided into a first row decoder 121A and a second row decoder 121B, and the page buffer circuit 122 may be divided into a first page buffer circuit 122A and a second page buffer circuit 122B. The first row decoder 121A may be disposed to overlap with the left upper edge portion of the memory cell array 110, and the second row decoder 121B may be disposed to overlap with the right lower edge portion of the memory cell array 110. The first page buffer circuit 122A may be disposed to overlap with the upper right edge portion of the memory cell array 110, and the second page buffer circuit 122B may be disposed to overlap with the lower left edge portion of the memory cell array 110. In this example, the first and second row decoders 121A and 121B and the first and second page buffer circuits 122A and 122B may completely overlap with the memory cell array 110 in the vertical direction VD. By disposing the row decoder 121 and the page buffer circuit 122 to completely overlap with the memory cell array 110, it is possible to reduce the size of the memory device 100.

Figure 5:
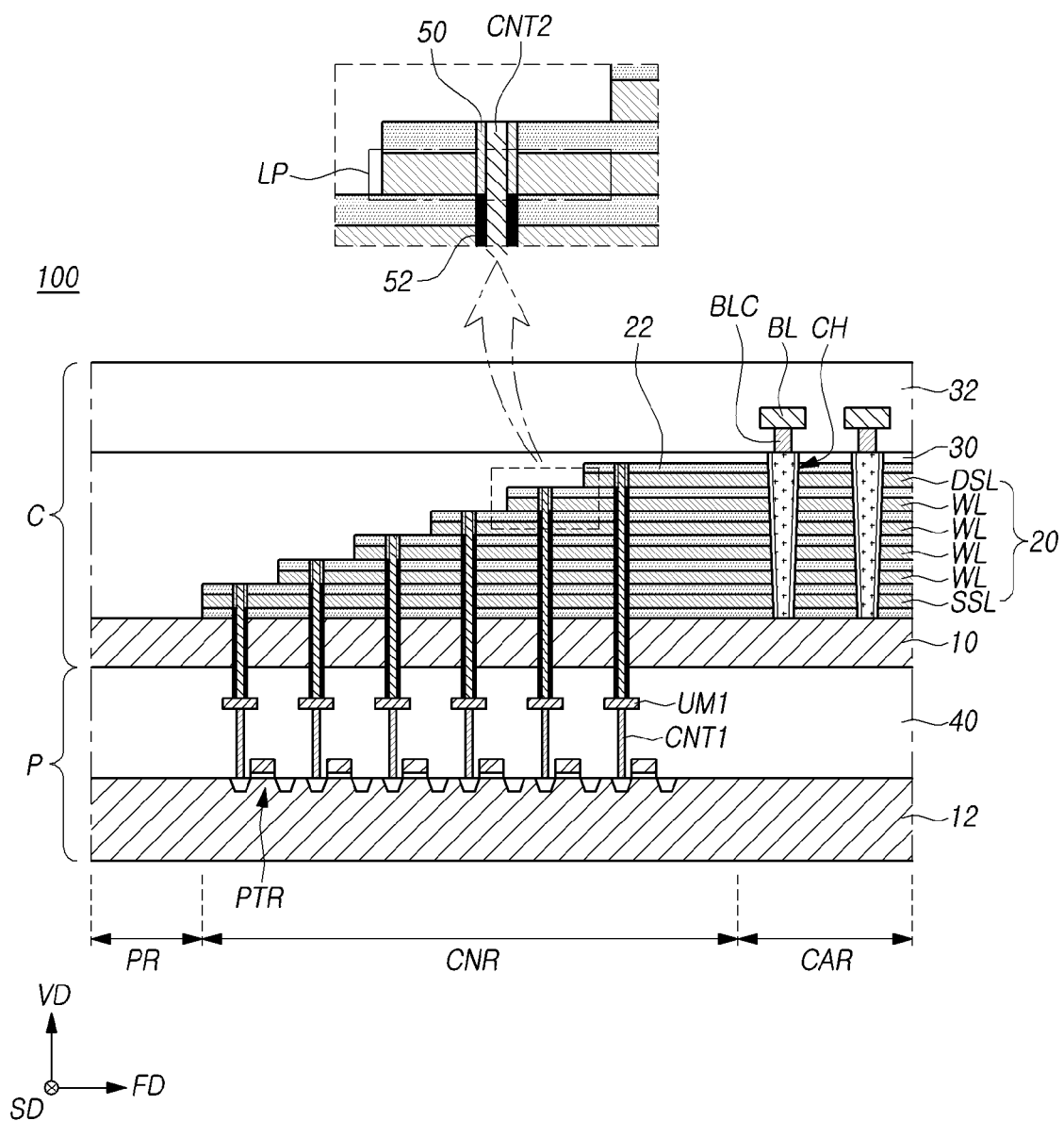
FIG. 5 is a cross-sectional view illustrating a representation of a memory device in accordance with an embodiment of the disclosure.

FIG. 5 is a cross-sectional view illustrating a representation of a memory device 100 in accordance with an embodiment of the disclosure.

Referring to FIG. 5, a memory structure C may be stacked on a logic structure P. The memory structure C may include a first substrate 10, and a plurality of electrode layers 20 and a plurality of interlayer dielectric layers 22, which are alternately stacked on the first substrate 10. The plurality of electrode layers 20 and the plurality of interlayer dielectric layers 22 may configure an electrode structure.

The electrode layers 20 may include a conductive material. For example, the electrode layers 20 may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). Among the electrode layers 20, at least one electrode layer 20 when viewed from the lowermost electrode layer 20 may configure a source select line SSL. Among the electrode layers 20, at least one electrode layer 20 when viewed from the uppermost electrode layer 20 may configure a drain select line DSL. The electrode layers 20 between the source select line SSL and the drain select line DSL may configure word lines WL. The interlayer dielectric layers 22 may include silicon oxide.

The memory device 100 or the first substrate 10 may include a cell region CAR, a coupling region CNR, and a peripheral region PR. The coupling region CNR may be disposed at a periphery of the cell region CAR, and the peripheral region PR may be disposed at a periphery of the coupling region CNR. The cell region CAR, the coupling region CNR and the peripheral region PR may be sequentially disposed in the first direction FD.

In the coupling region CNR, each of the electrode layers 20 may have a pad part LP that projects, beyond the next electrode layer 20 positioned on the electrode layer 20. FIG. 5 shows that the pad part LP projects in the first direction FD, but the present invention is not limited thereto. For example, the pad part LP may project in the second direction SD. The pad part LP of the electrode layer 20 does not overlap with the electrode layer 20 positioned above the electrode layer 20. The electrode structure may have a step structure that is configured by the pad parts LP of the electrode layers 20. The step structure of the electrode structure may have a shape that steps down away from the cell region CAR.

A plurality of vertical channels CH that pass through the electrode layers 20 and the interlayer dielectric layers 22 in the vertical direction VD may be defined in the cell region CAR. While not illustrated in detail, each of the vertical channels CH may include a channel layer and a gate dielectric layer. The channel layer may include polysilicon or monocrystalline silicon, and may include, in some regions thereof, a P-type impurity such as boron (B). The gate dielectric layer may have the shape of a straw or a cylindrical shell that surrounds the outer wall of the channel layer. The gate dielectric layer may include a tunnel dielectric layer, a charge storage layer and a blocking layer that are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked. Source select transistors may be configured in areas or regions where the source select line SSL surrounds the vertical channels CH. Memory cells may be configured in areas or regions where the word lines WL surround the vertical channels CH. Drain select transistors may be configured in areas or regions where the drain select line DSL surrounds the vertical channels CH.

A dielectric layer 30 may be defined on the first substrate 10 to cover the top surfaces and the side surfaces of the electrode layers 20 and the interlayer dielectric layers 22, which are alternately stacked, and to cover the side surfaces of the vertical channels CH.

A plurality of bit lines BL may be disposed over the dielectric layer 30 and the vertical channels CH. The bit lines BL may extend in the second direction SD, and may be arranged in the first direction FD. Bit line contacts BLC may be defined under the bit lines BL to couple the bit lines BL and the vertical channels CH to each other. A dielectric layer 32 may be defined on the dielectric layer 30 to cover the bit lines BL.

The logic structure P may include a second substrate 12 and a plurality of pass transistors PTR, which are defined on the second substrate 12. The pass transistors PTR may be disposed in the coupling region CNR. Each of the pass transistors PTR may overlap with the pad part LP of a corresponding electrode layer 20.

Contacts CNT1, which are coupled to the pass transistors PTR, respectively, may be defined on the pass transistors PTR. Lower wiring lines UM1 may be defined on the contacts CNT1 and may be coupled to the contacts CNT1, respectively. Each of the lower wiring lines UM1 may overlap with a corresponding pass transistor PTR in the vertical direction VD, and may be coupled to a junction region of the corresponding pass transistor PTR through the contacts CNT1. A dielectric layer 40 may be defined on the second substrate 12 to cover the pass transistors PTR, the contacts CNT1 and the lower wiring lines UM1. The memory structure C may be disposed on the dielectric layer 40.

A plurality of contacts CNT2 pass through the step structure of the electrode structure in the vertical direction VD. Each of the contacts CNT2 may pass through the pad part LP of a corresponding electrode layer 20. Each of the contacts CNT2 may be coupled to a corresponding lower wiring line UM1 by passing through the first substrate 10 and the dielectric layer 40 under the step structure. Each of the contacts CNT2 may be coupled to a pass transistor PTR through the corresponding lower wiring lines UM1 and the contacts CNT1.

The contacts CNT2 may include a conductive material. For example, the contacts CNT2 may include at least one selected from among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). In an embodiment, the contacts CNT2 may be formed at the same process step as the electrode layers 20, and may be formed of the same material as the electrode layers 20. In another embodiment, the contacts CNT2 may be formed at different process step from the electrode layers 20. In this case, a material forming the contacts CNT2 may be different from a material forming the electrode layers 20.

A sidewall conductive layer 50 may be defined on the outer wall of each contact CNT2 to couple the contact CNT2 and the pad part LP of a corresponding electrode layer 20. The sidewall conductive layer 50 may have the shape of a straw or a cylinder shell which surrounds the outer wall of the upper end portion of each contact CNT2. The sidewall conductive layer 50 may include a conductive material. For example, the sidewall conductive layer 50 may include at least one selected from among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). In an embodiment, the sidewall conductive layer 50 may be formed at the same process step as the electrode layers 20, and may be formed of the same material as the electrode layers 20.

A sidewall dielectric layer 52 may be defined on the outer wall of each contact CNT2 to isolate the contact CNT2 from the other electrode layers 20 except a corresponding electrode layer 20. The sidewall dielectric layer 52 may have the shape of a straw or a cylinder shell which surrounds the lower outer wall of the contact CNT2 that is not covered by the sidewall conductive layer 50. The sidewall dielectric layer 52 may be formed of an oxide.

Figure 6:
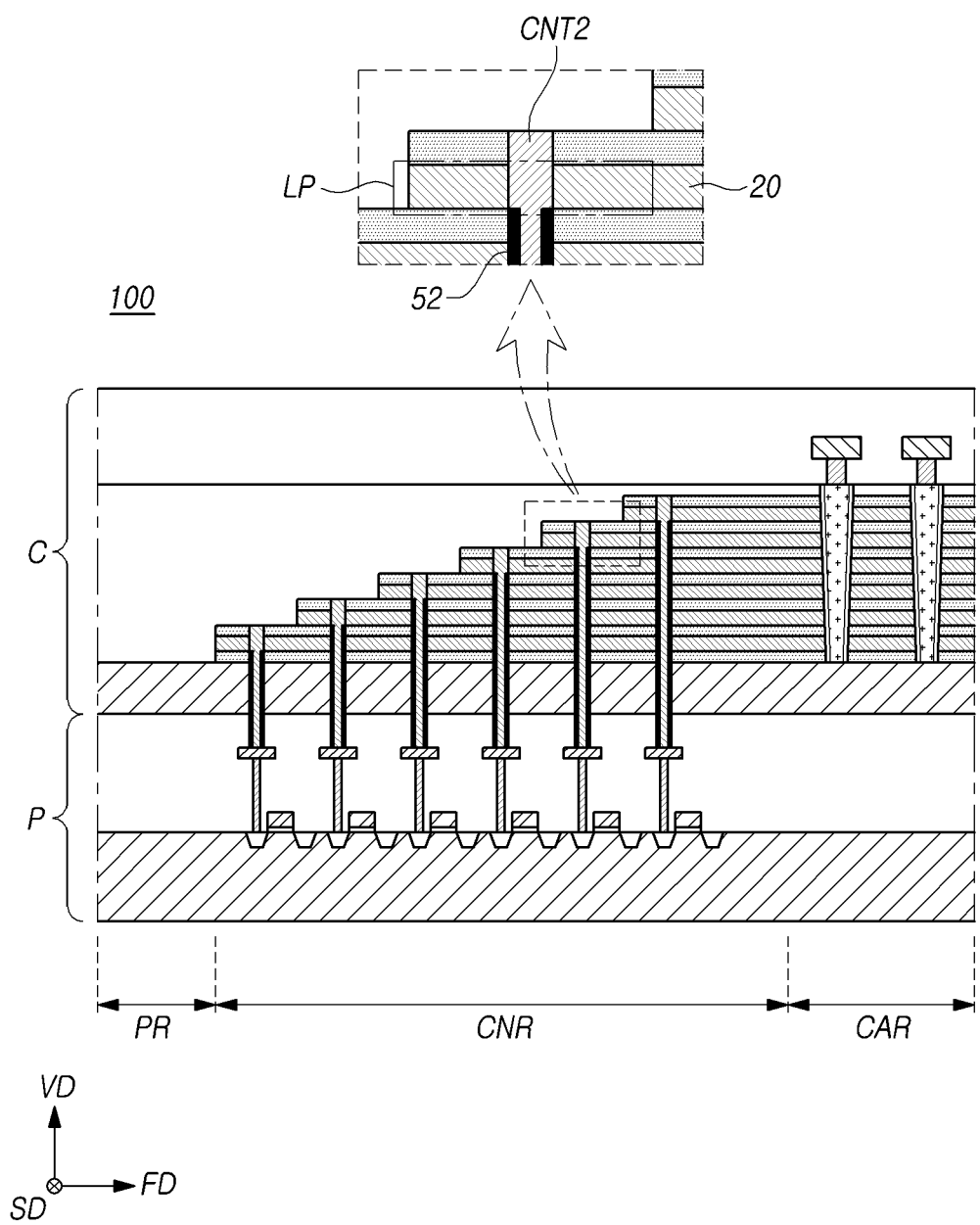
FIGS. 6 to 8 are cross-sectional views illustrating representations of memory devices in accordance with other embodiments of the disclosure.

FIG. 6 is a cross-sectional view illustrating a representation of a memory device in accordance with another embodiment of the disclosure.

Referring to FIG. 6, an upper end portion of each contact CNT2 that passes through a pad part LP of a corresponding electrode layer and the interlayer dielectric layer 22 above the pad part LP may have an increased width as compared to the remaining portion of the contact CNT2 that passes through the remainder of the electrode structure. The upper end portion of each contact CNT2 may be directly coupled to the pad part LP of the corresponding electrode layer 20, and the sidewall conductive layer 50 described above with reference to FIG. 5 may be omitted.

The contacts CNT2 may be formed at the same process step as the electrode layers 20, and may be formed of the same material as the electrode layers 20. A sidewall dielectric layer 52 may be formed to surround the outer wall of the contact CNT2 under the upper end portion of the contact CNT2 which has the increased width. The sidewall dielectric layer 52 may be disposed to isolate the contact CNT2 from the other electrode layers 20.

Figure 7:
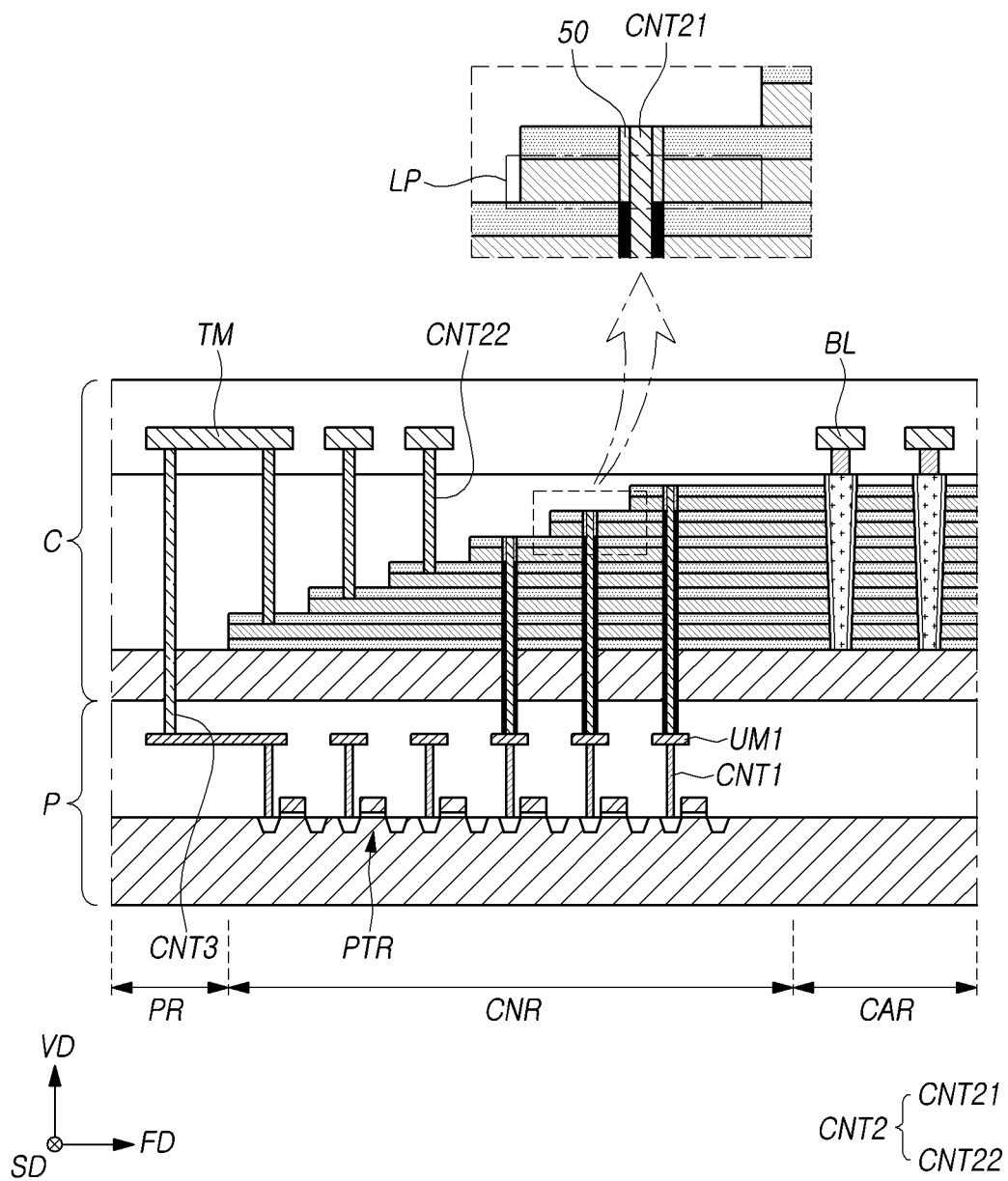

FIG. 7 is a cross-sectional view illustrating a representation of a memory device in accordance with still another embodiment of the disclosure.

Referring to FIG. 7, a plurality of contacts CNT2 may be coupled to pad parts LP of electrode layers 20, respectively. At least one of the contacts CNT2 may pass through a step structure in the vertical direction VD, and the remaining contacts CNT2 may not pass through the step structure and may project upward from the step structure in the vertical direction VD. A contact CNT2 that passes through the step structure may be defined as a first contact CNT21, and the contacts CNT2 that project upward from the step structure in the vertical direction VD may be defined as second contacts CNT22.

The first contact CNT21 may pass through a pad part LP of a corresponding electrode layer 20 in the vertical direction VD. The first contact CNT21 may be coupled to a corresponding lower wiring line UM1 by passing through the electrode structure, a first substrate 10 and a dielectric layer 40, and may be coupled to a corresponding pass transistor PTR through the corresponding lower wiring line UM1 and a contact CNT1. A sidewall conductive layer 50 may be defined on the outer wall of an upper end portion of the first contact CNT21 to couple the first contact CNT21 to the pad part LP of the corresponding electrode layer 20.

Each second contact CNT22 may project upward from the pad part LP of a corresponding electrode layer 20 in the vertical direction VD. The bottom end of the second contact CNT22 may be coupled to the pad part LP of the corresponding electrode layer 20, and the top end of the second contact CNT22 may be coupled to an upper wiring line TM, which is defined over the step structure. The upper wiring line TM may be disposed at the same layer as bit lines BL. The upper wiring line TM may be coupled to a corresponding lower wiring line UM1 through a contact CNT3, which is defined in a peripheral region PR, and may be coupled to a corresponding pass transistor PTR through the corresponding lower wiring line UM1 and a contact CNT1.

The first contact CNT21 may be disposed farther from the peripheral region PR than the second contact CNT22. The first contact CNT21 may be disposed closer to a cell region CAR than the second contact CNT22. The second contact CNT22 may be disposed closer to the peripheral region PR than the first contact CNT21. The second contact CNT22 may be disposed farther from the cell region CAR than the first contact CNT21.

By disposing the second contact CNT22 closer to the peripheral region PR than the first contact CNT21, the length of the upper wiring line TM that couples the second contact CNT22 and the contact CNT3 of the peripheral region PR may be shortened.

Figure 8:
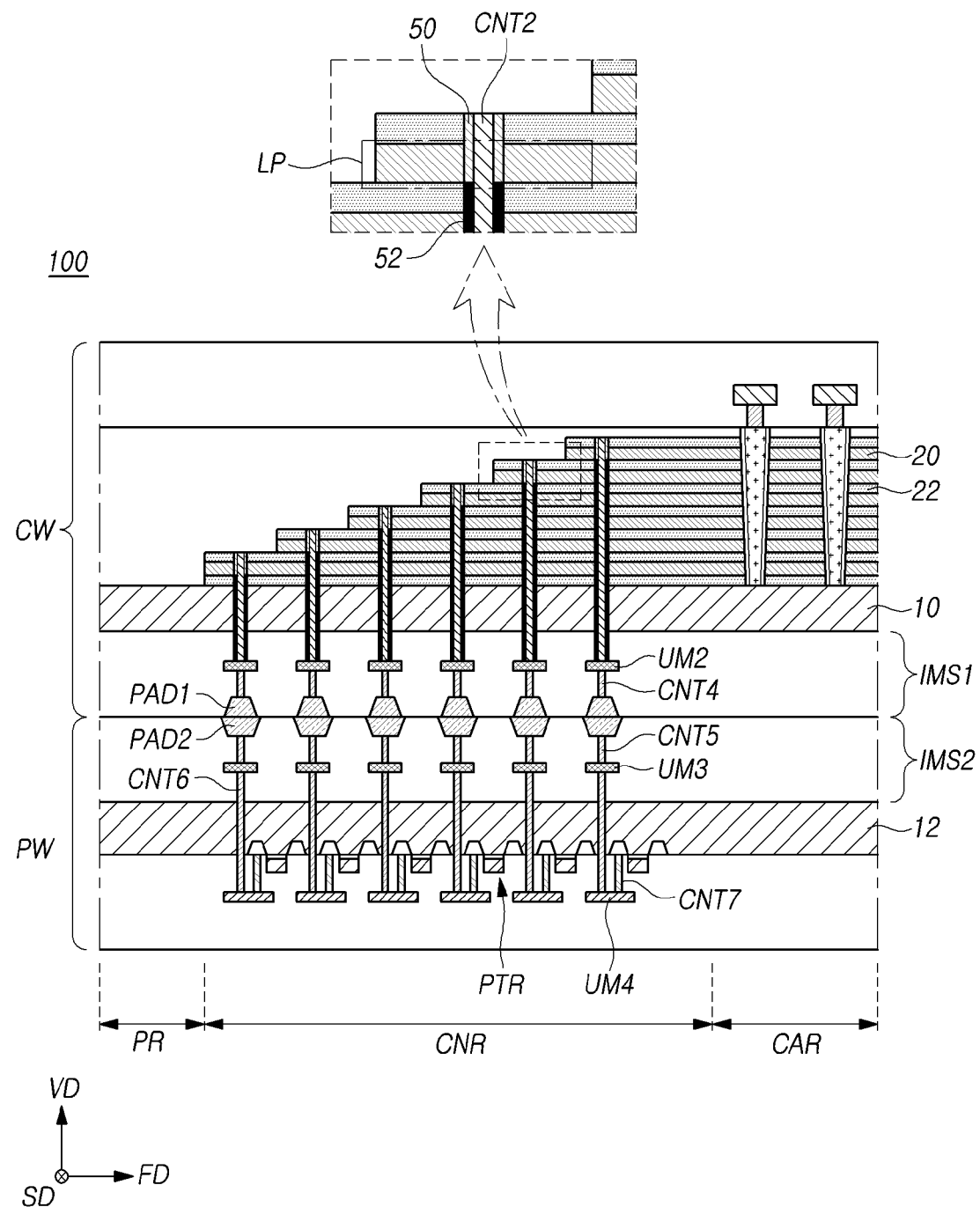

FIG. 8 is a cross-sectional view illustrating a representation of a memory device in accordance with yet another embodiment of the disclosure.

Referring to FIG. 8, a memory device 100 may include a peripheral wafer PW and a cell wafer CW that is bonded onto the peripheral wafer PW. The cell wafer CW may include a first interconnect structure IMS1 that is defined on the bottom surface of a first substrate 10. The first interconnect structure IMS1 may include a plurality of lower wiring lines UM2, a plurality of contacts CNT4, and a plurality of first bonding pads PAD1. Each of contacts CNT2 that passes through a step structure may be coupled to a corresponding lower wiring line UM2. The lower wiring lines UM2 may be coupled to the first bonding pads PAD1 through the contacts CNT4, respectively. The first bonding pads PAD1 may be exposed on the other surface of the first interconnect structure IMS1 that faces away from one surface of the first interconnect structure IMS1, which is contact with the first substrate 10. The other surface of the first interconnect structure IMS1 may constitute one surface of the cell wafer CW that is bonded to the peripheral wafer PW. Each of the first bonding pads PAD1 may be coupled to a pad part LP of a corresponding electrode layer 20 through the contacts CNT4 and CNT2 and the lower wiring line UM2. Each of the first bonding pads PAD1 may overlap with the pad part LP of the corresponding electrode layer 20 in the vertical direction VD.

The peripheral wafer PW may include a second substrate 12, a second interconnect structure IMS2, which is defined on one surface of the second substrate 12, and a plurality of pass transistors PTR, which are defined on the other surface of the second substrate 12 facing away from the one surface. The second interconnect structure IMS2 may include a plurality of lower wiring lines UM3, a plurality of contacts CNT5, and a plurality of second bonding pads PAD2. The second bonding pads PAD2 may be exposed on the other surface of the second interconnect structure IMS2 that faces away from one surface of the second interconnect structure IMS2, which is in contact with the second substrate 12. The other surface of the second interconnect structure IMS2 may constitute one surface of the peripheral wafer PW that is bonded to the cell wafer CW.

The contacts CNT5 may be coupled to the second bonding pads PAD2, respectively, and may be landed on the lower wiring lines UM3, respectively. Each of the lower wiring lines UM3 may be coupled to a corresponding pass transistor PTR through contacts CNT6 and CNT7 and a wiring line UM4. The embodiment illustrated in FIG. 8 represents a case in which the pass transistors PTR are disposed on the other surface of the second substrate 12 facing away from the one surface on which the second interconnect structure IMS2 is defined, but other embodiments are not so limited. For example, both the pass transistors PTR and the second interconnect structure IMS2 may be disposed on the one surface of the second substrate 12, and the second interconnect structure IMS2 may be disposed on the pass transistors PTR.

FIGS. 9A to 9H are representations of cross-sectional views to assist in the explanation of a method for manufacturing a memory device in accordance with an embodiment of the disclosure, according to a manufacturing sequence.

Figure 9A:
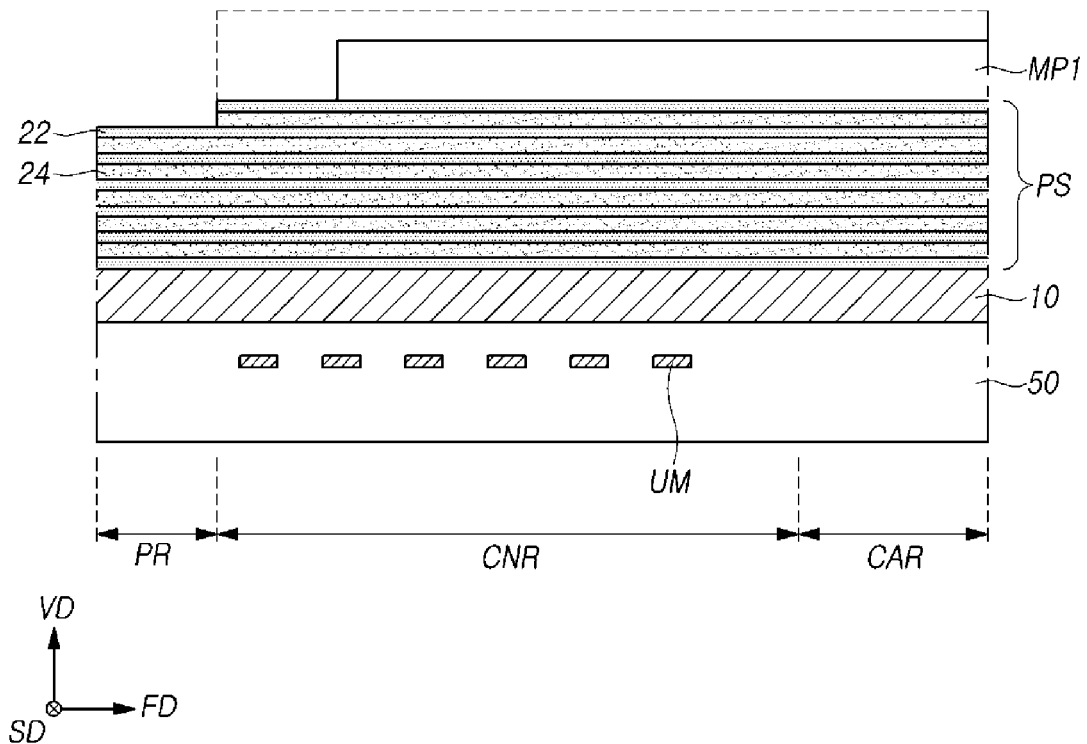
FIGS. 9A to 9H are representations of cross-sectional views to assist in the explanation of a method for manufacturing a memory device in accordance with an embodiment of the disclosure, according to a manufacturing sequence.

Referring to FIG. 9A, interlayer dielectric layers 22 and first sacrificial layers 24 may be alternately stacked on a first substrate 10, which is defined with a cell region CAR, a coupling region CNR and a peripheral region PR, and thereby, a pre-stack PS may be formed.

A dielectric layer 50 may be defined under the first substrate 10, and a plurality of lower wiring lines UM may be defined in the dielectric layer 50. In an embodiment, the lower wiring lines UM may correspond to the lower wiring lines UM1 illustrated in FIG. 5, and the dielectric layer 50 may correspond to the dielectric layer 40 illustrated in FIG. 5. In another embodiment, the lower wiring lines UM may correspond to the lower wiring lines UM2 illustrated in FIG. 8, and the dielectric layer 50 may correspond to the dielectric layer included in the first interconnect structure IMS1 illustrated in FIG. 8.

The interlayer dielectric layers 22 and the first sacrificial layers 24 may be formed of different materials. The first sacrificial layers 24 may be formed of a material which has an etching selectivity with respect to the interlayer dielectric layers 22. For example, the interlayer dielectric layers 22 may be formed of an oxide, and the first sacrificial layers 24 may be formed of a nitride.

A mask pattern MP1, which exposes the peripheral region PR and covers the cell region CAR and the coupling region CNR, may be formed on the pre-stack PS. The pre-stack PS may be etched by a pad etching process using the first mask pattern MP1 as an etch mask. An etching thickness of the pad etching process may correspond to a vertical pitch of the interlayer dielectric layers 22. The vertical pitch of the interlayer dielectric layers 22 may be defined as the sum of a thickness of one of the interlayer dielectric layers 20 and a thickness of one of the first sacrificial layers 24.

A trimming process may be performed for the first mask pattern MP1. Namely, isotropic etching may be performed for the first mask pattern MP1. The trimming process may be performed using an etchant capable of removing the first mask pattern MP1. Accordingly, the height and the width of the first mask pattern MP1 may be reduced. As the width of the first mask pattern MP1 is reduced, the area of the coupling region CNR exposed by the first mask pattern MP1 may be increased. The pad etching process and the trimming process may is constitute one cycle for forming one step in the coupling region CNR.

Figure 9B:
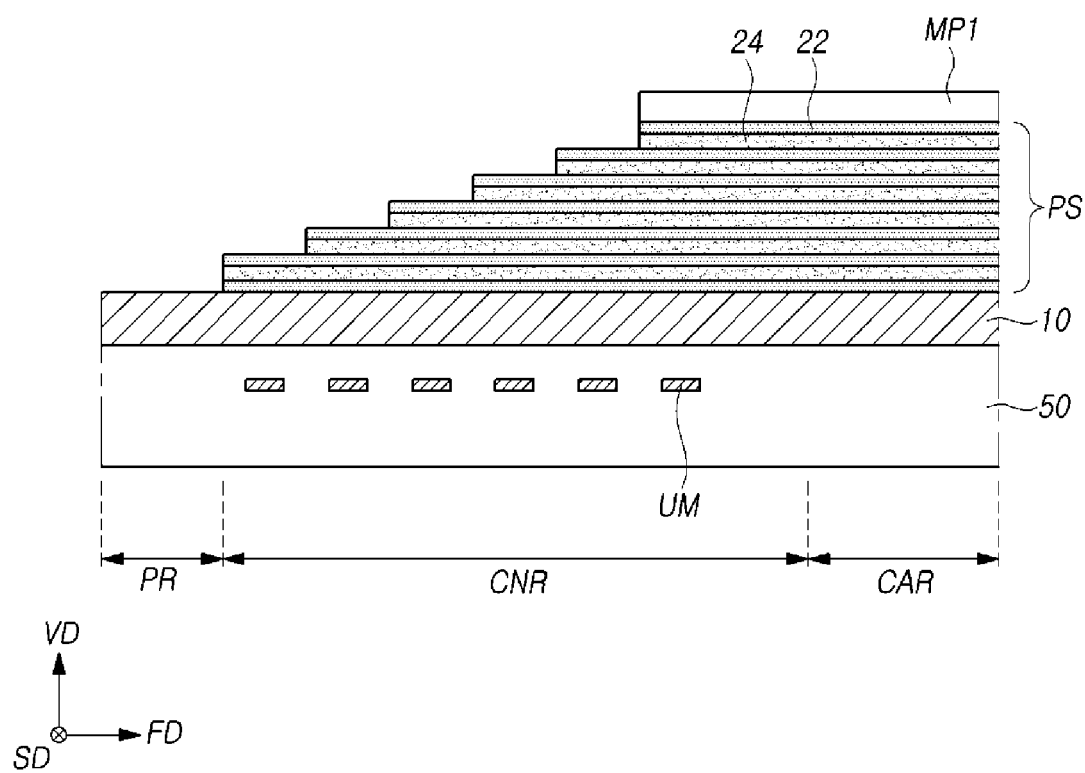

Referring to FIG. 9B, as the cycle for forming one step is repeated a multitude of times, a step structure may be formed in the pre-stack PS in the coupling region CNR. The step structure may have a plurality of step surfaces corresponding to the plurality of first sacrificial layers 24, respectively. The first mask pattern MP1 may be formed of a photoresist, and may be removed after the step structure is formed.

Figure 9C:
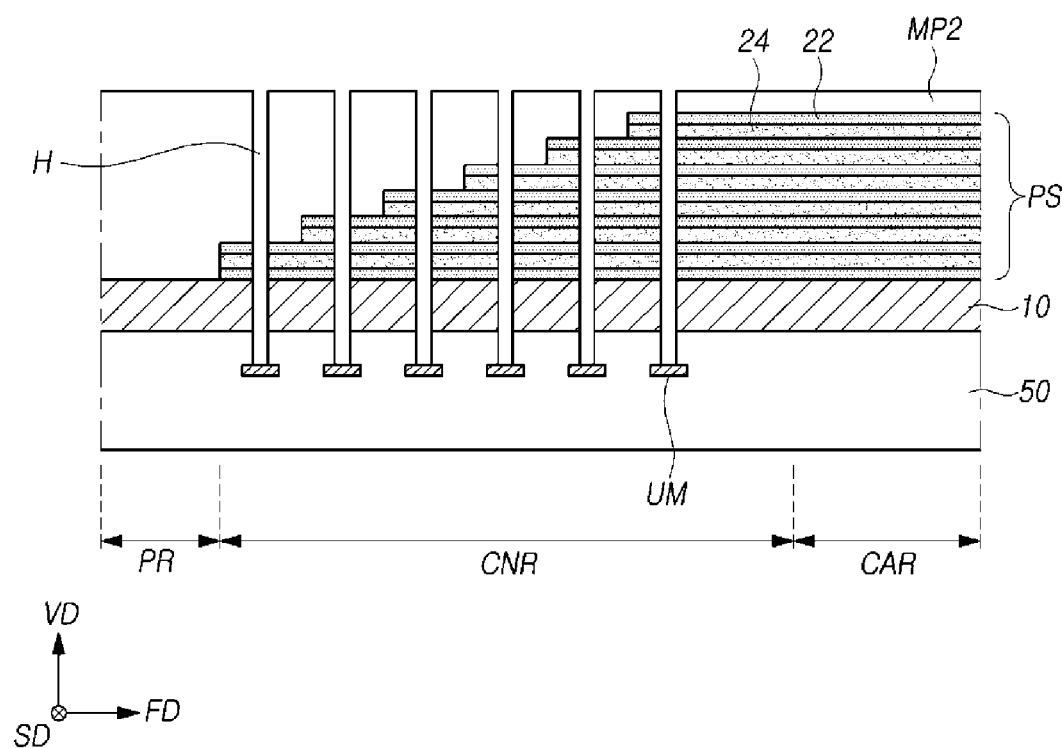

Referring to FIG. 9C, a second mask pattern MP2 having a plurality of openings that expose the step surfaces of the step structure may be formed on the first substrate 10 and the pre-stack PS that has been defined with the step structure. By etching the pre-stack PS, the first substrate 10 and the dielectric layer 50 by an etching process using the second mask pattern MP2 as an etch mask, contact holes H that expose the lower wiring lines UM may be formed. Although the present embodiment illustrates contact holes H that are formed through all of the step surfaces, the disclosure is not limited thereto. In other embodiments, contact holes H are formed through at least one of the step surfaces.

Figure 9D:
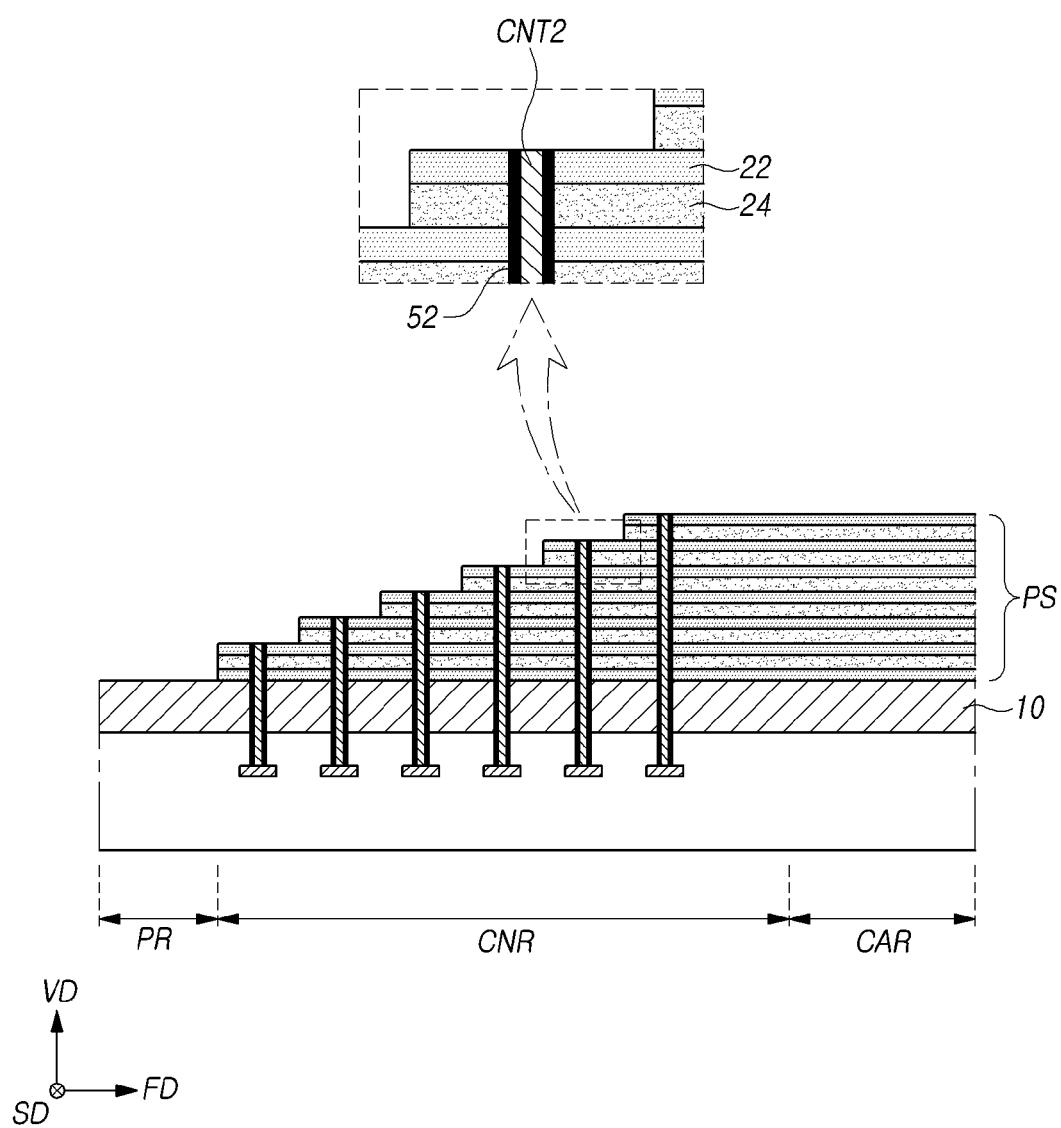

Referring to FIG. 9D, a sidewall dielectric layer 52 may be formed on the side surfaces of the contact holes H. The sidewall dielectric layer 52 may be formed of a material that has an etching selectivity with respect to the first sacrificial layers 24. For example, if the first sacrificial layers 24 are formed of a nitride, then the sidewall dielectric layer 52 may be formed of an oxide. A conductive material is filled in the contact holes H to form a plurality of contacts CNT2 that are coupled to the lower wiring lines UM.

Figure 9E:
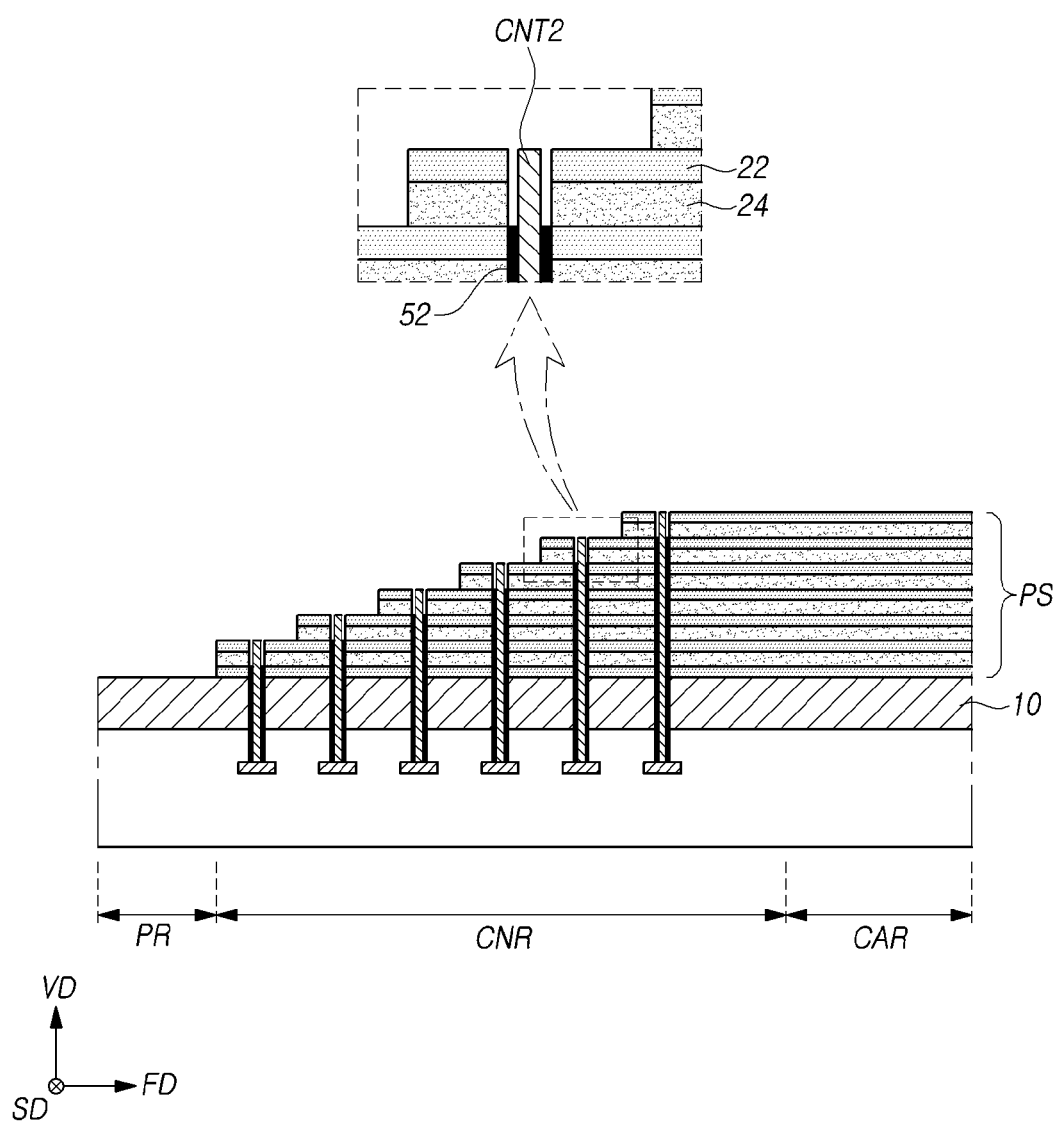

Referring to FIG. 9E, the sidewall dielectric layer 52 defined on the side surfaces of the upper end portions of the contacts CNT2 is removed. For each of the contacts CNT2, the side surfaces of the upper end portion of the contact and the side surfaces of the uppermost first sacrificial layer 24 and interlayer dielectric layer 22 may be exposed.

Figure 9F:
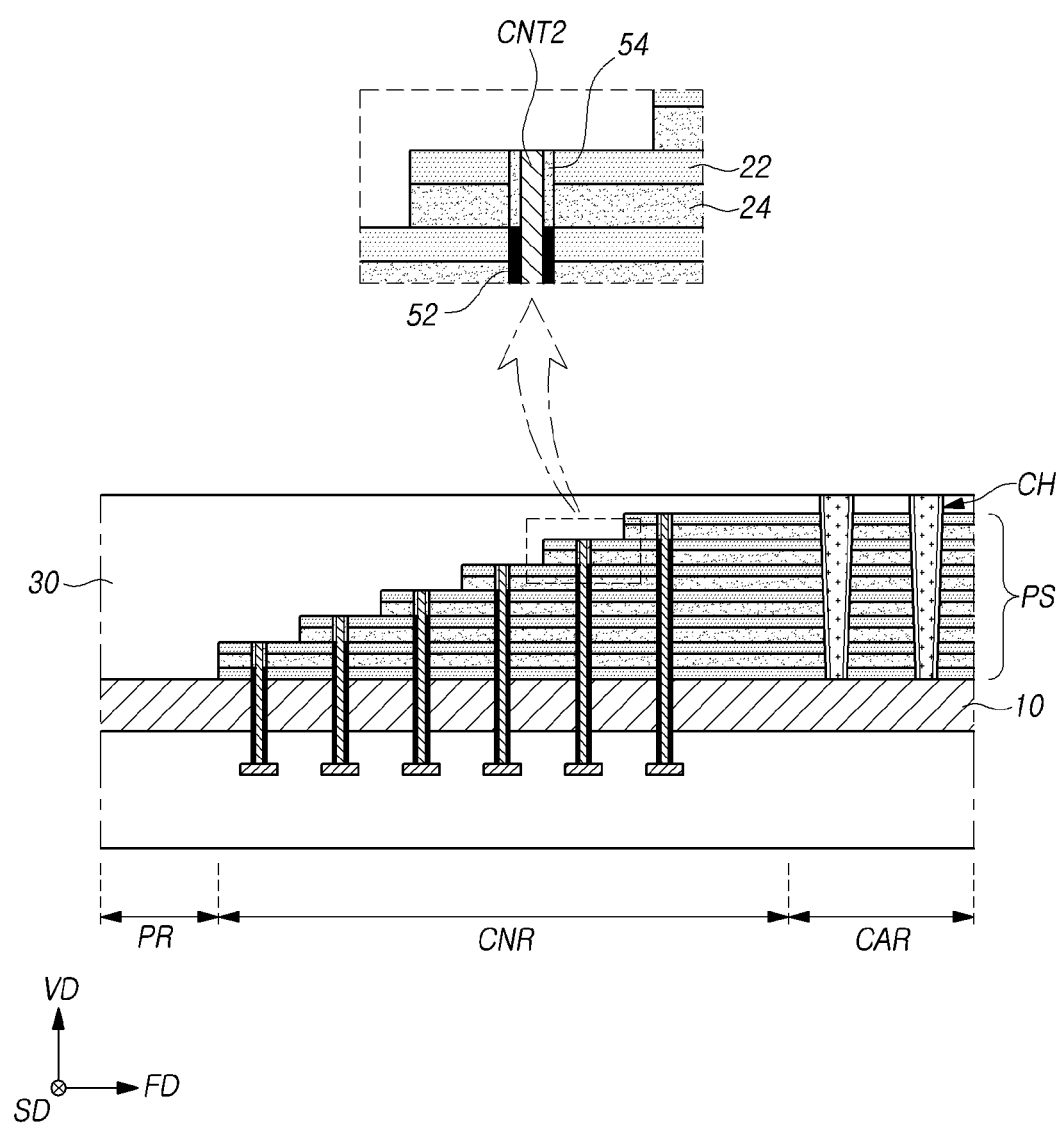

Referring to FIG. 9F, a second sacrificial layer 54 may be filled in spaces where the sidewall dielectric layer 52 is removed. The second sacrificial layer 54 may be formed of a material that has the same or a similar etching selectivity as or to the first sacrificial layers 24. For example, if the first sacrificial layers 24 are formed of a nitride, then the second sacrificial layer 54 may also be formed of a nitride.

A dielectric layer 30, which covers the pre-stack PS, the contacts CNT2 and the second sacrificial layer 54, may be formed on the first substrate 10. The dielectric layer 30 may be formed of a material that has an etching selectivity with respect to the first sacrificial layers 24 and the second sacrificial layer 54. For example, if the first sacrificial layers 24 and the second sacrificial layer 54 are formed of a nitride, then the dielectric layer 30 may be formed of an oxide.

In the cell region CAR, a plurality of channel holes that pass through the dielectric layer 30 and the pre-stack PS in the vertical direction VD may be formed, and, while not illustrated in detail, a gate dielectric layer and a channel layer are sequentially formed in the channel holes, a plurality of vertical channels CH may be defined.

Figure 9G:
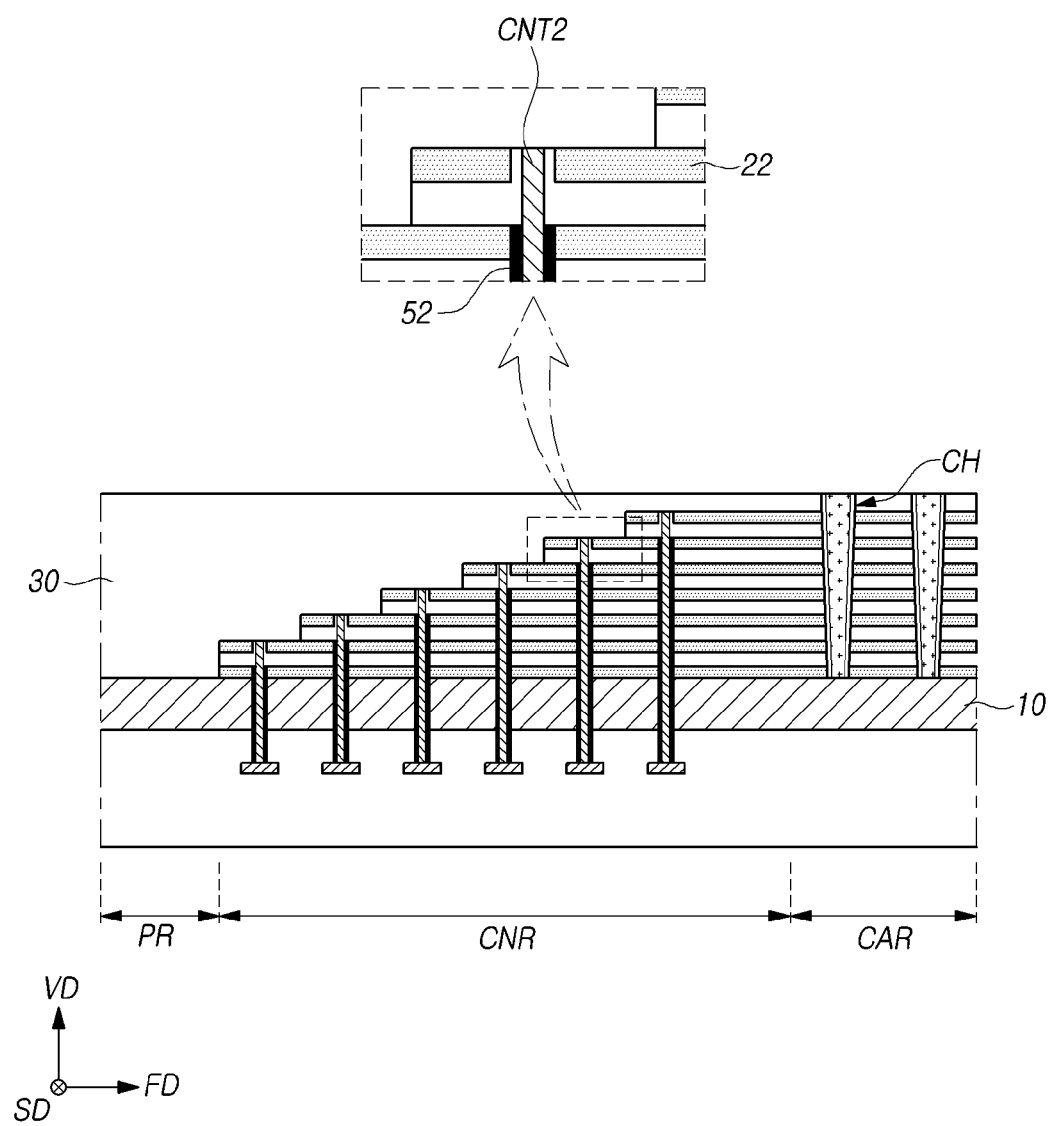

Referring to FIG. 9G, the first sacrificial layers 24 and the second sacrificial layer 54 may be removed. In order to remove the first sacrificial layers 24 and the second sacrificial layer 54, a wet etching process using an etchant capable of removing the first sacrificial layers 24 and the second sacrificial layer 54 may be performed.

Figure 9H:
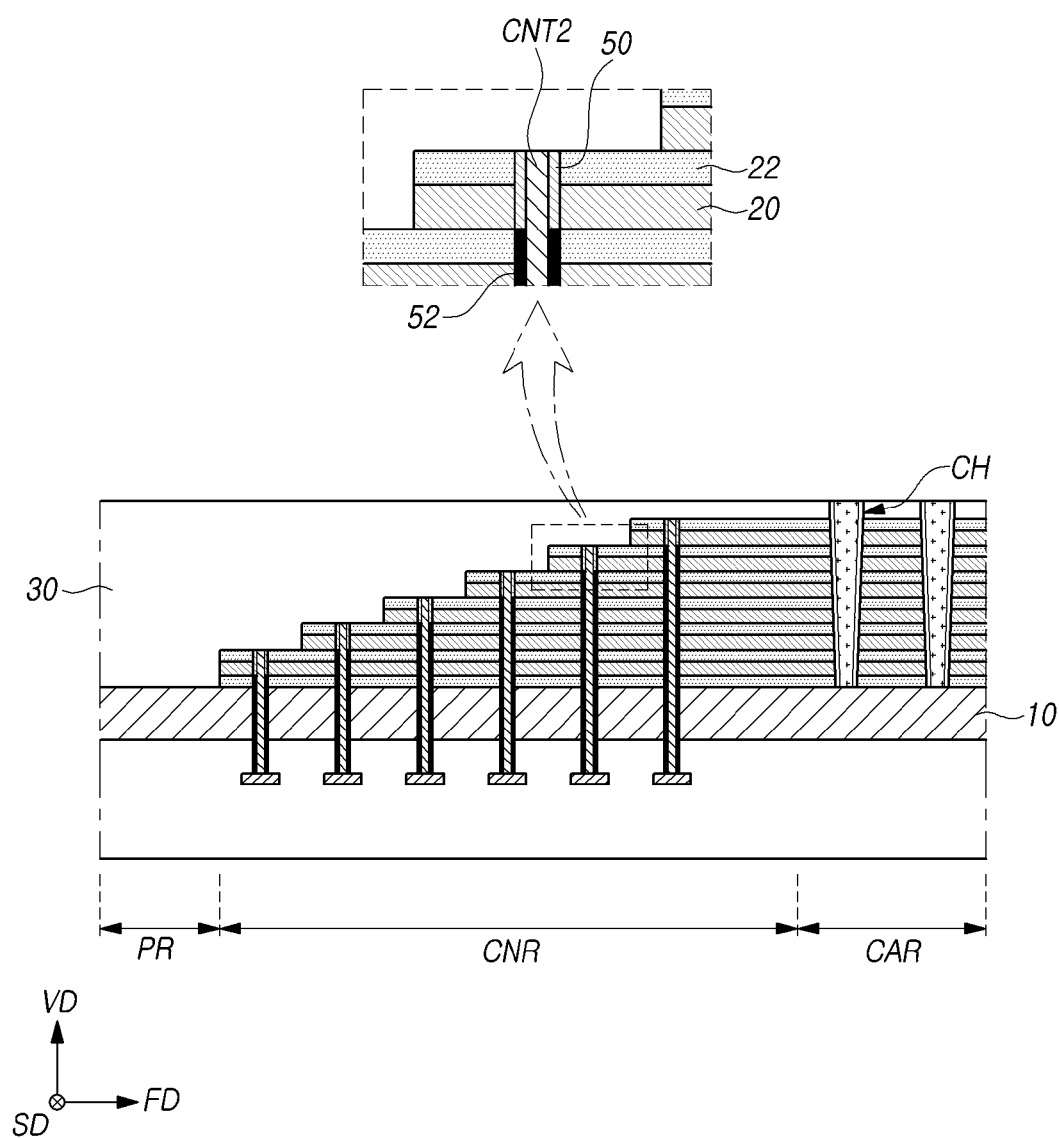

Referring to FIG. 9H, a conductive material may be filled in spaces where the first sacrificial layers 24 and the second sacrificial layer 54 are removed. Accordingly, the first sacrificial layers 24 may be replaced with electrode layers 20, and the second sacrificial layer 54 may be replaced with a sidewall conductive layer 50. The conductive material may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum).

FIGS. 10A to 10E are representations of cross-sectional views to assist in the explanation of a method for manufacturing a memory device in accordance with another embodiment of the disclosure, according to a manufacturing sequence.

Previously, as described above with reference to FIGS. 9A to 9C, a pre-stack PS may be formed as a plurality of interlayer dielectric layers 22 and a plurality of first sacrificial layers 24 that are alternately stacked on a first substrate 10, and a step structure may be formed in the pre-stack PS when a pad etching process and a trimming process are repeated a multitude of times. By etching the pre-stack PS, the first substrate 10 and a dielectric layer 50 from the step surfaces of the step structure, a plurality of contact holes (H of FIG. 9C) which expose lower wiring lines UM, respectively, may be formed.

Figure 10A:
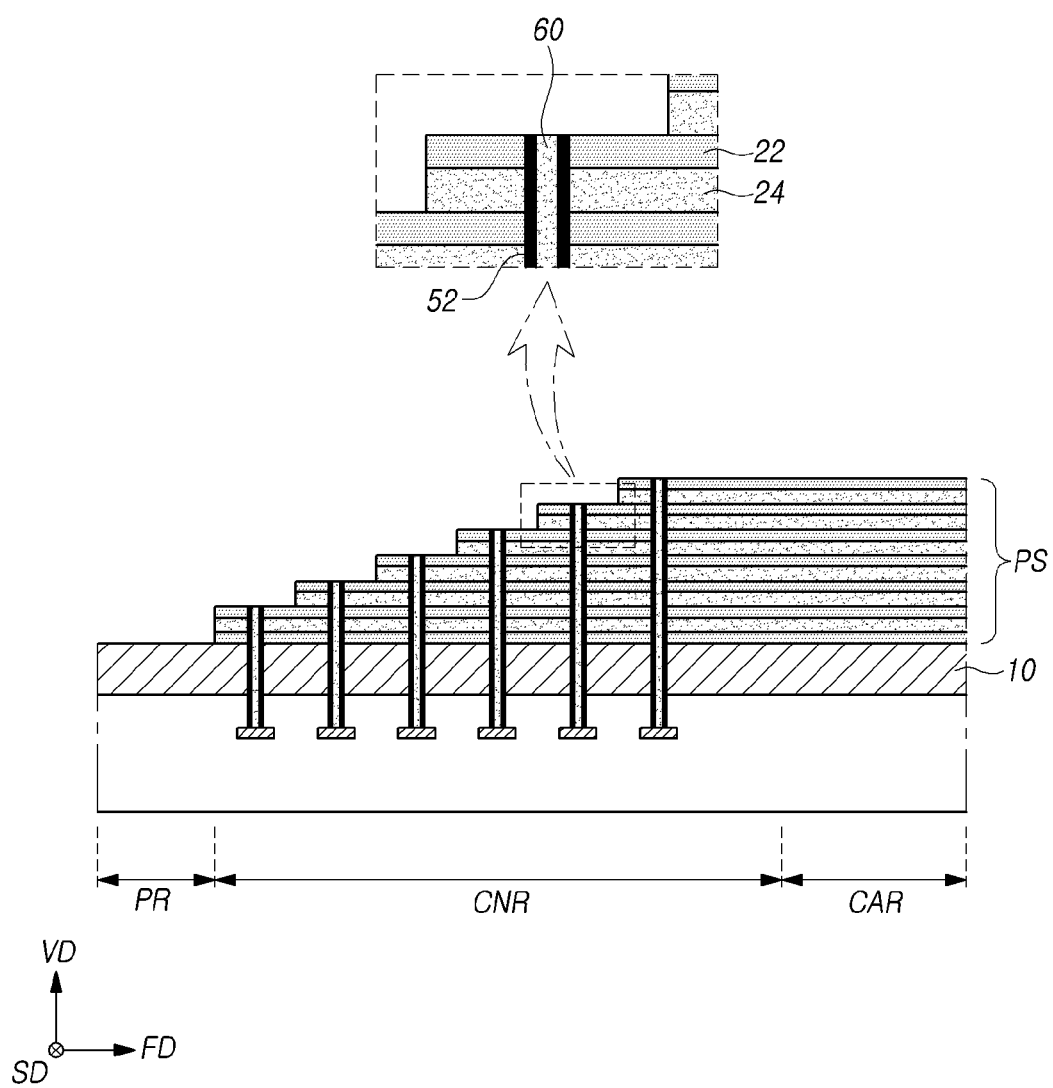
FIGS. 10A to 10E are representations of cross-sectional views to assist in the explanation of a method for manufacturing a memory device in accordance with another embodiment of the disclosure, according to a manufacturing sequence.

Referring to FIG. 10A, a sidewall dielectric layer 52 may be formed on the side surfaces of the contact holes (H of FIG. 9C). The sidewall dielectric layer 52 may be formed of a material that has an etching selectivity with respect to the first sacrificial layers 24. For example, if the first sacrificial layers 24 are formed of a nitride, then the sidewall dielectric layer 52 may be formed of an oxide.

Sacrificial pillars 60 may be formed in the contact holes H. The sacrificial pillars 60 may be formed of a material that has the same or a similar etching selectivity as or to the first sacrificial layers 24. For example, if the first sacrificial layers 24 are formed of a nitride, then the sacrificial pillars 60 may also be formed of a nitride.

Figure 10B:
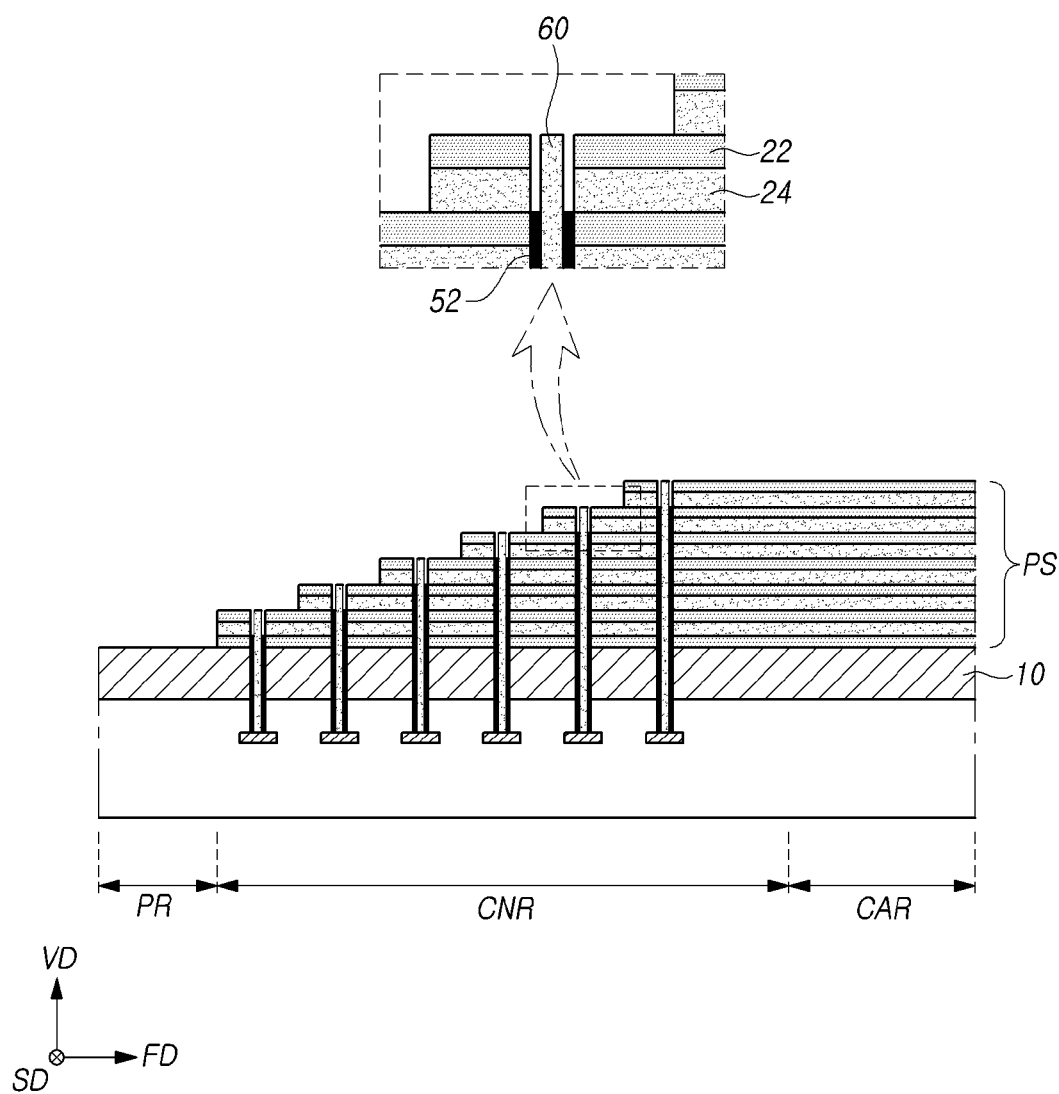

Referring to FIG. 10B, as the sidewall dielectric layer 52 defined on the side surfaces of the upper end portions of the sacrificial pillars 60 is removed, the side surface of the upper end portion of each of the sacrificial pillars 60 and the side surface of the uppermost first sacrificial layer 24 and interlayer dielectric layer 22, through which each contact hole (H of FIG. 9c) passes, may be exposed.

Figure 10C:
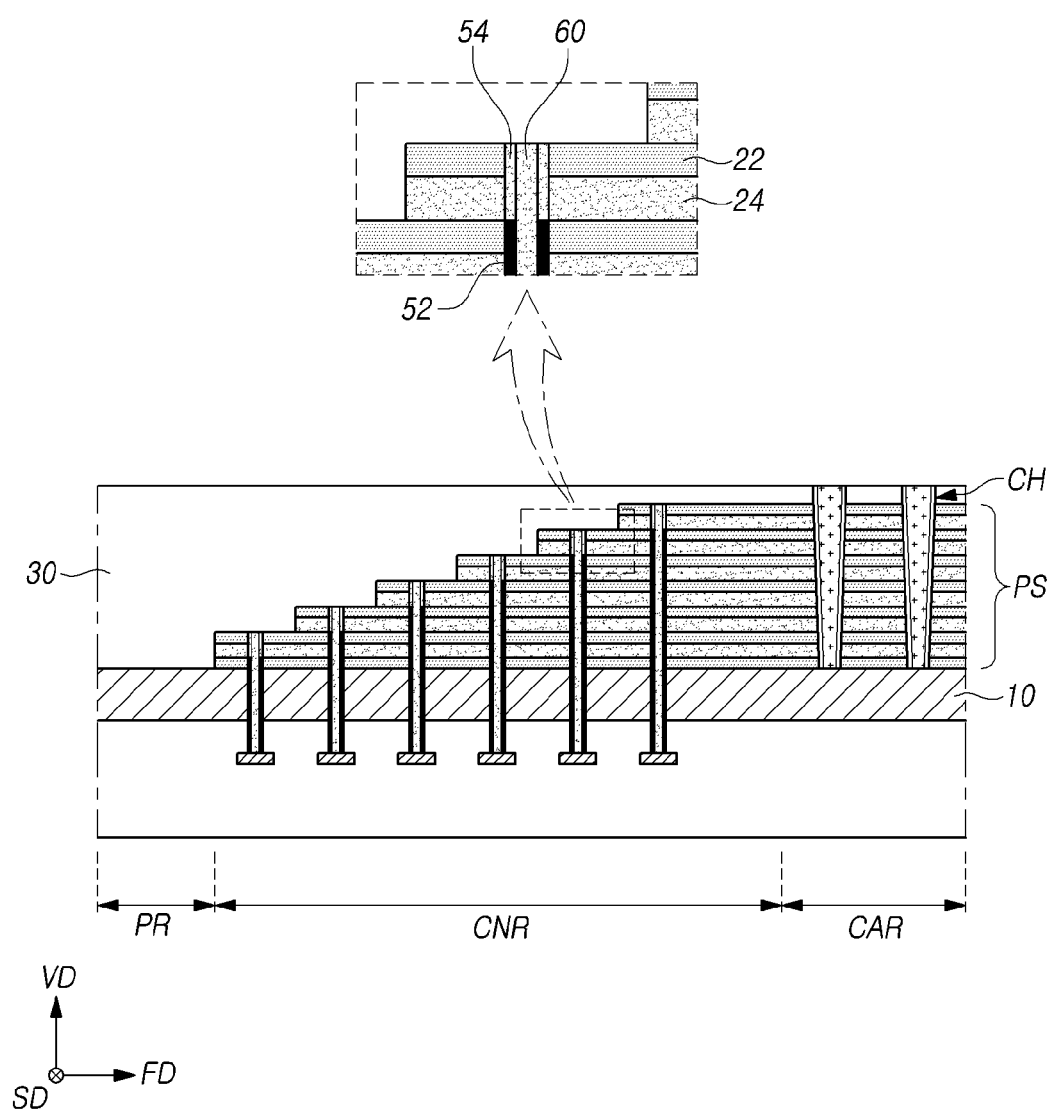

Referring to FIG. 10C, a second sacrificial layer 54 may fill in spaces from which the sidewall dielectric layers 52 are removed. The second sacrificial layer 54 may be formed of a material that has the same or a similar etching selectivity as or to the first sacrificial layers 24. For example, if the first sacrificial layers 24 are formed of a nitride, then the second sacrificial layer 54 may also be formed of a nitride.

A dielectric layer 30 that covers the pre-stack PS, the sacrificial pillars 60 and the second sacrificial layer 54 may be formed on the first substrate 10. The dielectric layer 30 may be formed of a material that has an etching selectivity with respect to the first sacrificial layers 24, the second sacrificial layer 54 and the sacrificial pillars 60. For example, if the first sacrificial layers 24, the second sacrificial layer 54 and the sacrificial pillars 60 are formed of a nitride, then the dielectric layer 30 may be formed of an oxide.

In a cell region CAR, a plurality of channel holes that pass through the dielectric layer 30 and the pre-stack PS in the vertical direction VD may be formed, and, while not illustrated in detail, a gate dielectric layer and a channel layer are sequentially formed in the channel holes, a plurality of vertical channels CH may be defined.

Figure 10D:
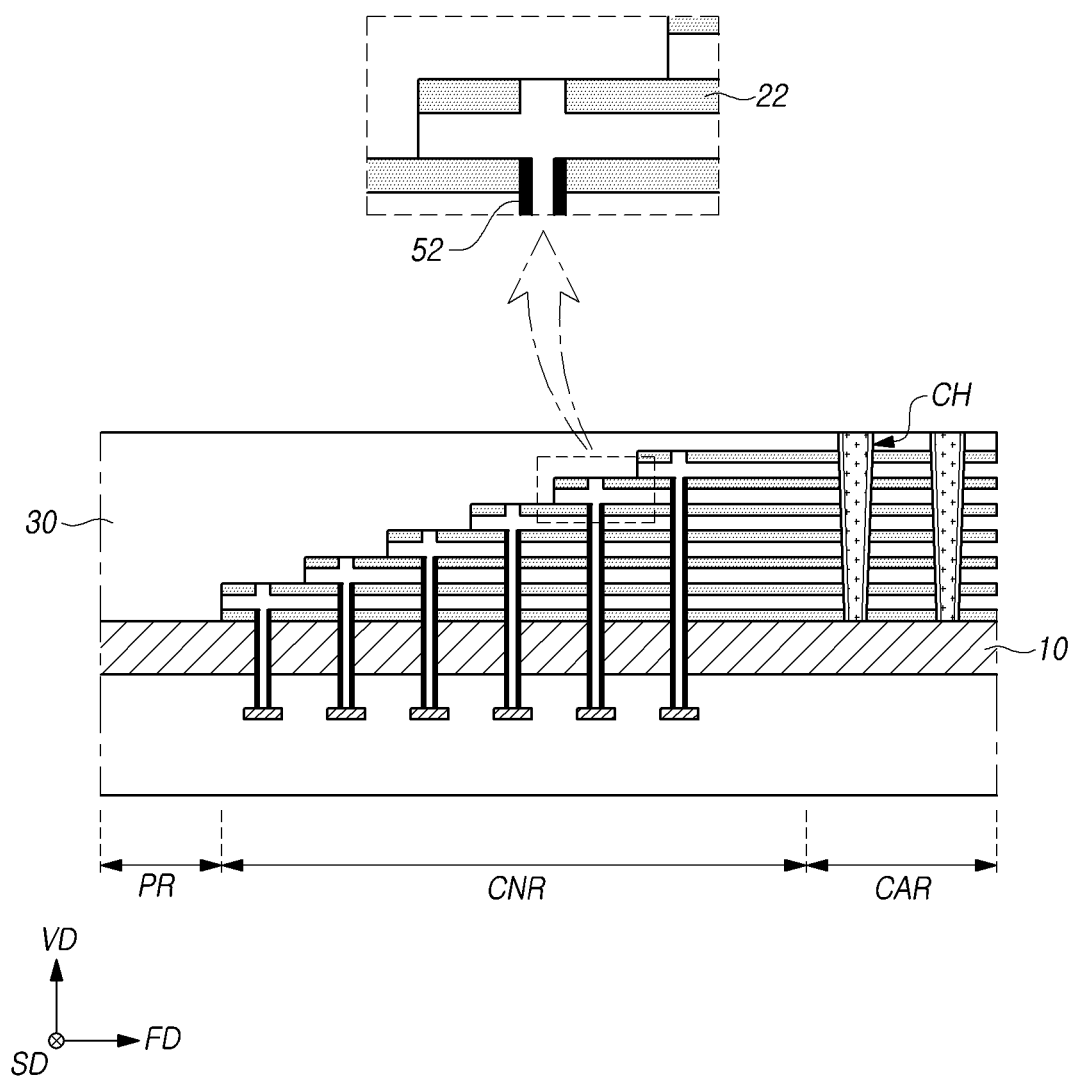

Referring to FIG. 10D, the first sacrificial layers 24, the second sacrificial layer 54 and the sacrificial pillars 60 may be removed. In order to remove the first sacrificial layers 24, the second sacrificial layer 54 and the sacrificial pillars 60, a wet etching process using an etchant capable of removing the first sacrificial layers 24, the second sacrificial layer 54 and the sacrificial pillars 60 may be performed.

Figure 10E:
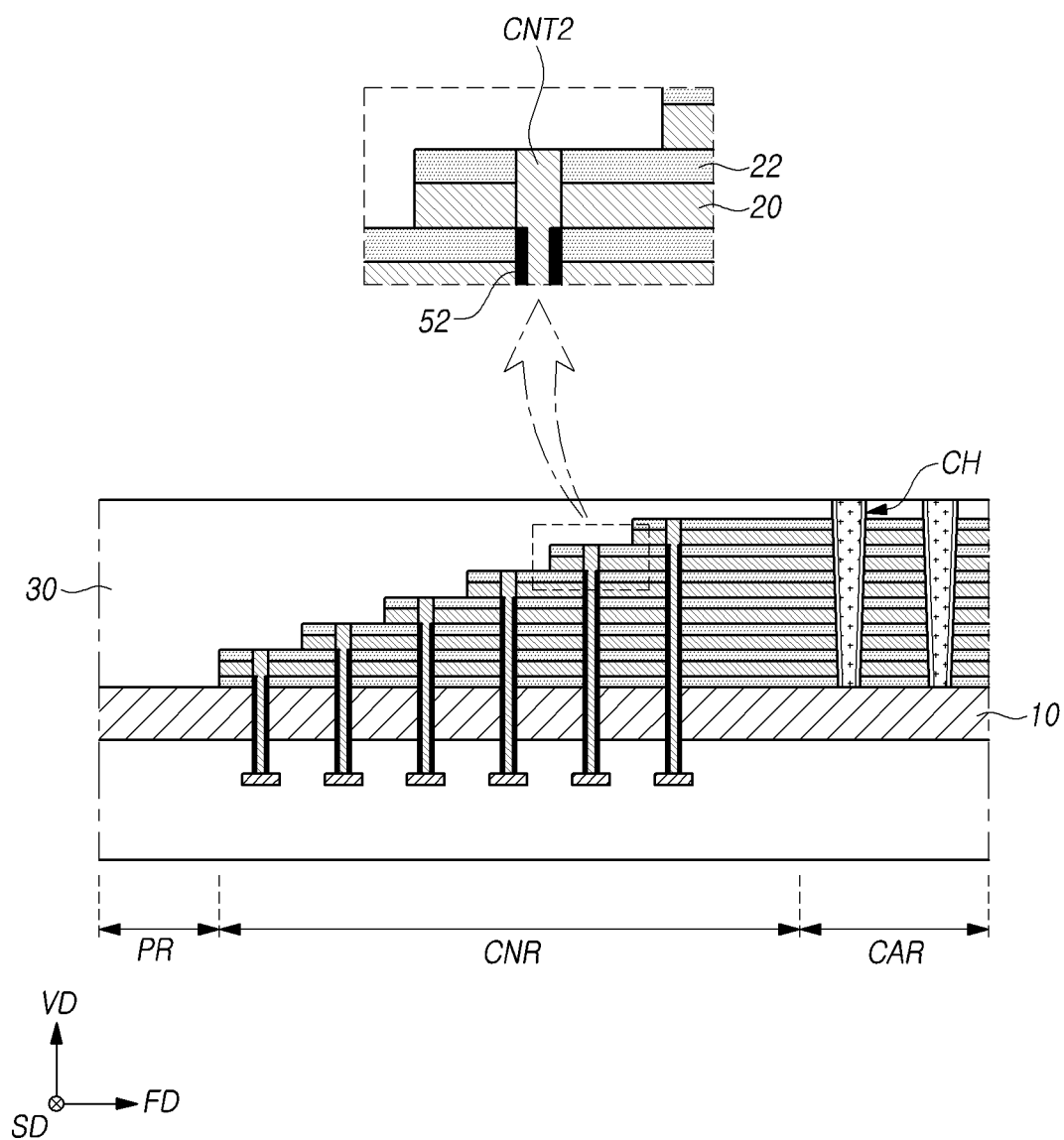

Referring to FIG. 10E, a conductive material may fill in spaces from which the first sacrificial layers 24, the second sacrificial layer 54 and the sacrificial pillars 60 are removed. Accordingly, the first sacrificial layers 24 may be replaced with electrode layers 20, and the second sacrificial layer 54 and the sacrificial pillars 60 may be replaced with contacts CNT2, which may be directly coupled to corresponding electrode layers 20.

Hereunder, effects according to the embodiments of the disclosure will be described.

Figure 11:
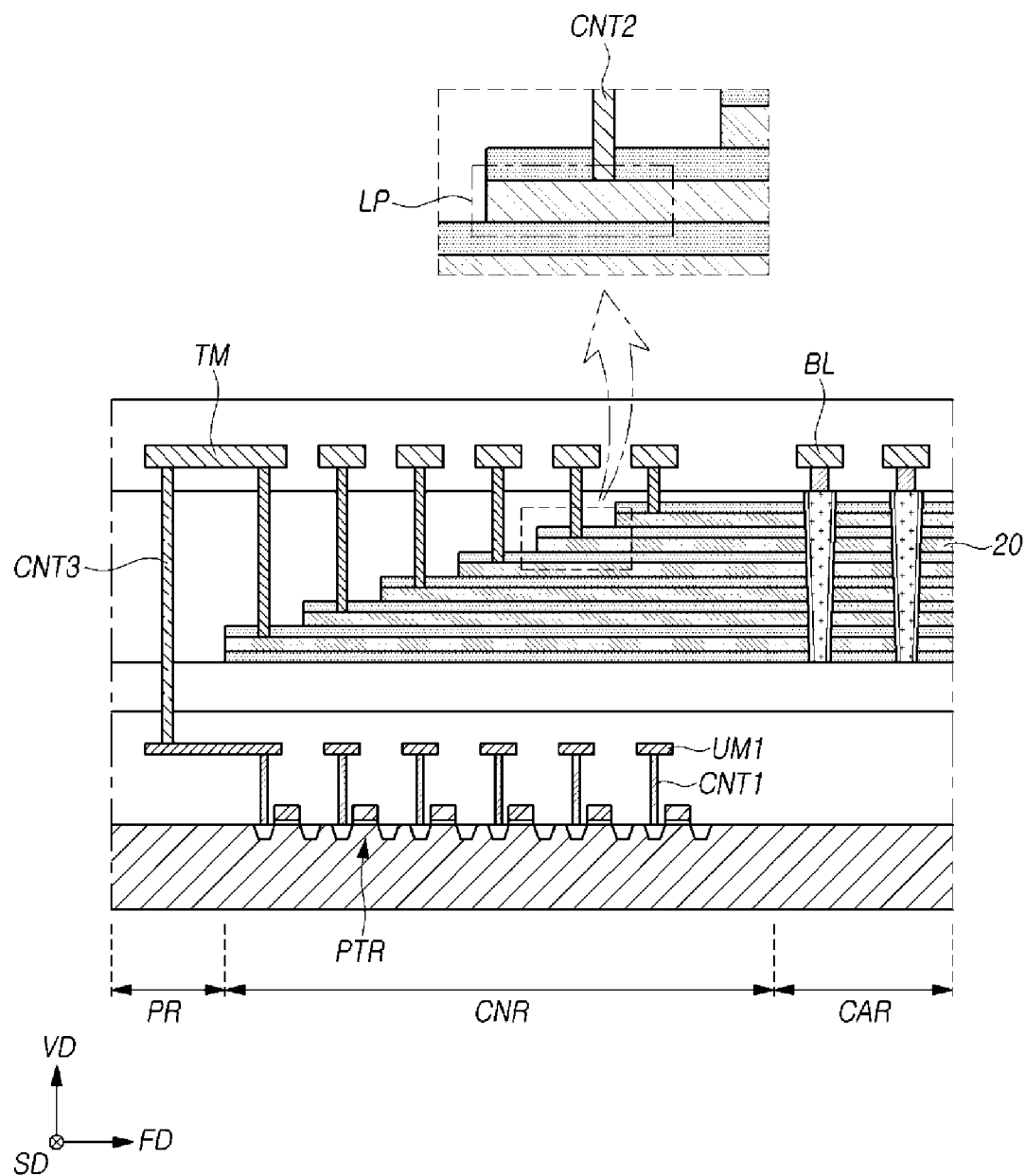
FIG. 11 is a cross-sectional view illustrating a representation of a memory device related to the disclosure.

FIG. 11 is a cross-sectional view illustrating a representation of a memory device related to the disclosure.

Referring to FIG. 11, in a coupling region CNR, each of contacts CNT2 may extend upward from a pad part LP of an electrode layer 20 in the vertical direction VD, and may be coupled to a corresponding upper wiring line TM. Each of upper wiring lines TM may be routed from a corresponding contact CNT2 to a peripheral region PR, may be coupled to a contact CNT3, which is defined in the peripheral region PR. In this manner, each of upper wiring lines TM may be coupled to a corresponding pass transistor PTR through contacts CNT3 and CNT1 and a lower wiring line UM1.

The number of upper wiring lines TM may be substantially the same as the number of electrode layers 20. If the number of electrode layers 20 is increased with the degree of integration, the number of upper wiring lines TM will also be increased. Therefore, a large number of upper wiring lines TM are disposed within a limited area to form a bottleneck, and it is difficult to route each upper wiring line TM to the peripheral region PR and avoid the other upper wiring lines TM at the same time.

In order to properly land contacts CNT2, the width of the pad parts LP of the electrode layers 20 should have a minimum predetermined size. Thus, variations in length among the upper wiring lines TM that couple the contacts CNT2 defined on the pad parts LP of the electrode layers 20 and the contacts CNT3 of the peripheral region PR may be numerous. Due to such deviations in length among the upper wiring lines TM, differences in loading among routing paths that couple the electrode layers 20 and the pass transistors PTR may increase, thereby degrading the operation characteristics and reliability of the memory device.

As is apparent from the above descriptions, according to the embodiments of the disclosure, a contact that passes through a pad part of an electrode layer in a vertical direction and thereby couples the electrode layer and a pass transistor may be provided. Therefore, the structure of a wiring line that couples the electrode layer and the pass transistor may be simplified, and an area required for the disposition of the wiring line may be reduced. Also, because differences in length among routing paths that couple electrode layers and pass transistors may be reduced, loading uniformity among the routing paths may be improved, thereby contributing to the improvement in the operation characteristics and reliability of a memory device. In addition, portions of an upper wiring layer over the electrode layers that are not used for the disposition of wiring lines coupling the electrode layers and the pass transistors can be made available for other lines, and it is possible to contribute to increasing the margin of other wiring lines disposed in the upper wiring layer.

Figure 12:
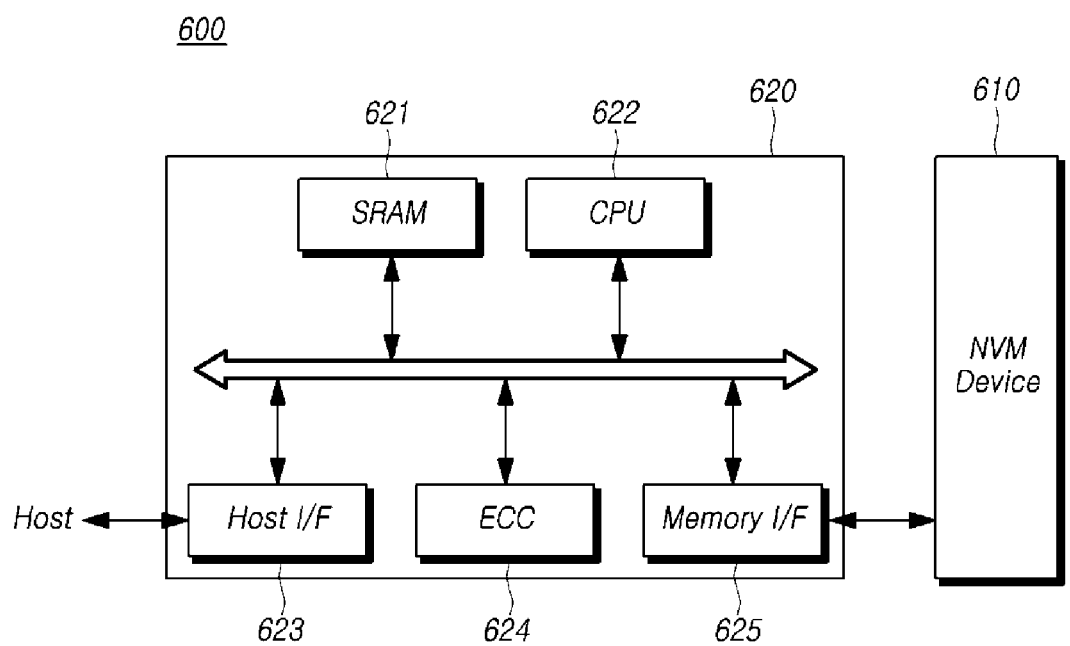
FIG. 12 is a block diagram schematically illustrating a memory system including a memory device in accordance with embodiments of the disclosure.

FIG. 12 is a block diagram schematically illustrating a memory system including a memory device in accordance with embodiments of the disclosure.

Referring to FIG. 12, a memory system 600 in accordance with an embodiment may include a nonvolatile memory device 610 and a memory controller 620.

The nonvolatile memory device 610 may be constituted by a memory device described above and may operate in the manner described above. The memory controller 620 may be configured to control the nonvolatile memory device (NVM Device) 610. The combination of the nonvolatile memory device 610 and the memory controller 620 may be configured as a memory card or a solid state disk (SSD). An SRAM 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device 610.

A memory interface (MEMORY I/F) 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

Figure 13:
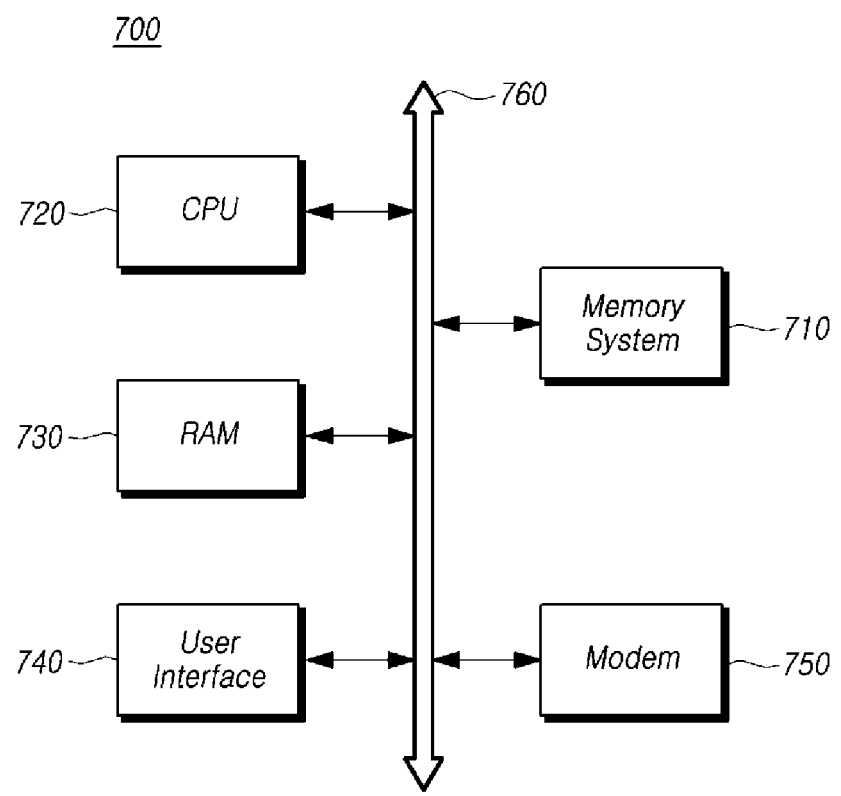
FIG. 13 is a block diagram schematically illustrating a computing system including a memory device in accordance with an embodiment of the disclosure.

FIG. 13 is a block diagram schematically illustrating a computing system including a memory device in accordance with an embodiment of the disclosure.

Referring to FIG. 13, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A three-dimensional memory device comprising:
   an electrode structure including a plurality of interlayer dielectric layers and a plurality of electrode layers that are alternately stacked on a first substrate, each of the plurality of electrode layers having a pad part which does not overlap with another electrode layer positioned on the electrode layer;
   a pass transistor positioned below the first substrate; and
   a first contact passing through the electrode structure from the pad part of one of the plurality of electrode layers, and coupling the pad part and the pass transistor.

2. The three-dimensional memory device according to claim 1, wherein the pass transistor and the pad part that are coupled to each other through the first contact overlap with each other in a vertical direction.

3. The three-dimensional memory device according to claim 1, wherein the first contact and the plurality of electrode layers comprise the same material.

4. The three-dimensional memory device according to claim 1, further comprising:
   a sidewall conductive layer defined on a side surface of the first contact that is disposed to couple the first contact to the pad part; and
   a sidewall dielectric layer defined on the side surface of the first contact to isolate the first contact from other electrode layers in the electrode structure.

5. The three-dimensional memory device according to claim 4, wherein the sidewall conductive layer and the plurality of electrode layers comprise the same material.

6. The three-dimensional memory device according to claim 1, wherein an upper end portion of the first contact is directly coupled to the pad part.

7. The three-dimensional memory device according to claim 6, wherein the upper end portion of the first contact has an increased width compared to a remaining portion of the first contact.

8. The three-dimensional memory device according to claim 6, further comprising:
   a sidewall dielectric layer defined on a side surface of the first contact to isolate the first contact from other electrode layers in the electrode structure.

9. The three-dimensional memory device according to claim 1, further comprising:
   a second contact projecting from one of the plurality of pad parts in a vertical direction.

10. The three-dimensional memory device according to claim 9,
    wherein the first substrate includes a cell region, a peripheral region, and a coupling region between the cell region and the peripheral region, wherein the electrode structure is disposed in the cell region and the coupling region, and the plurality of pad parts, the first contact and the second contact are disposed in the coupling region, and wherein the second contact is disposed closer to the peripheral region than the first contact.

11. The three-dimensional memory device according to claim 1, wherein the pass transistor is disposed on a second substrate below the first substrate.

12. The three-dimensional memory device according to claim 1, further comprising:

a first interconnect structure defined under the first substrate, wherein the first interconnect structure includes a first bonding pad, which is coupled to the first contact, on a first surface facing away from a second surface that contacts the first substrate.

13. The three-dimensional memory device according to claim 12, wherein the first bonding pad overlaps, in a vertical direction, with the pad part that is coupled to the first contact.

14. The three-dimensional memory device according to claim 12, wherein the pass transistor is disposed in a peripheral wafer that is bonded to the first surface of the first interconnect structure, and wherein the peripheral wafer includes a second interconnect structure including a second bonding pad that is coupled to the pass transistor and that is bonded to the first bonding pad.

* * * * *